(12) United States Patent
Kanatzidis et al.

(10) Patent No.: US 10,379,230 B2
(45) Date of Patent: Aug. 13, 2019

(54) CHALCO-PHOSPHATE-BASED HARD RADIATION DETECTORS

(71) Applicant: Northwestern University, Evanston, IL (US)

(72) Inventors: Mercouri G. Kanatzidis, Wilmette, IL (US); Peng L. Wang, Evanston, IL (US); Bruce W. Wessels, Wilmette, IL (US); Zhifu Liu, Wilmette, IL (US)

(73) Assignee: NORTHWESTERN UNIVERSITY, Evanston, IL (US)

( * ) Notice: Subject to any disclaimer, the term of this patent is extended or adjusted under 35 U.S.C. 154(b) by 0 days.

(21) Appl. No.: 15/578,852

(22) PCT Filed: Jun. 1, 2016

(86) PCT No.: PCT/US2016/035183
§ 371 (c)(1),
(2) Date: Dec. 1, 2017

(87) PCT Pub. No.: WO2017/030624
PCT Pub. Date: Feb. 23, 2017

(65) Prior Publication Data
US 2018/0164447 A1    Jun. 14, 2018

Related U.S. Application Data

(60) Provisional application No. 62/170,237, filed on Jun. 3, 2015.

(51) Int. Cl.
*G01T 1/24* (2006.01)
*H01L 31/032* (2006.01)
*H01L 31/115* (2006.01)
*G01T 7/00* (2006.01)

(52) U.S. Cl.
CPC ................ *G01T 1/24* (2013.01); *G01T 7/00* (2013.01); *H01L 31/032* (2013.01); *H01L 31/115* (2013.01)

(58) Field of Classification Search
CPC .......... G01T 1/2928; G01T 1/20; G01T 1/24; G01T 7/00; H01L 31/032; H01L 31/115
See application file for complete search history.

(56) References Cited

U.S. PATENT DOCUMENTS

| | | |
|---|---|---|
| 6,323,489 B1 | 11/2001 | McClellan |
| 6,585,913 B2 | 7/2003 | Lyons et al. |
| 6,699,406 B2 | 3/2004 | Riman et al. |
| 7,067,816 B2 | 6/2006 | Dorenbos et al. |

(Continued)

OTHER PUBLICATIONS

Babanly et al., Phase Equilibria and Thermodynamic Properties of the Hg—Tl—Te System, (1983), pp. 524-528.

(Continued)

*Primary Examiner* — Kiho Kim
(74) *Attorney, Agent, or Firm* — Bell & Manninng, LLC; Michelle Manning

(57) ABSTRACT

Methods and devices for detecting incident radiation, such as incident x-rays or gamma-rays, are provided. The methods and devices use high purity, high quality single-crystals of inorganic semiconductor compounds having the formula $A_2P_2X_6$, where A represents Pb or Sn and X represents S or Se, as photoelectric materials.

20 Claims, 18 Drawing Sheets

(56) References Cited

U.S. PATENT DOCUMENTS

| | | | |
|---|---|---|---|
| 7,141,794 | B2 | 11/2006 | Srivastava et al. |
| 7,368,719 | B2 | 5/2008 | Srivastava et al. |
| 7,576,329 | B2 | 8/2009 | Srivastava et al. |
| 7,608,201 | B2 | 10/2009 | Iltis |
| 8,021,636 | B2 | 9/2011 | Iltis |
| 8,519,347 | B2 | 8/2013 | Kanatzidis et al. |
| 2001/0006214 | A1 | 7/2001 | Boerner et al. |
| 2001/0008271 | A1 | 7/2001 | Ikeda et al. |
| 2004/159793 | A1 | 8/2004 | Brabec et al. |
| 2006/0289774 | A1 | 12/2006 | Endo et al. |
| 2008/0067391 | A1 | 3/2008 | Shimizu et al. |
| 2009/0179155 | A1 | 7/2009 | Irving |
| 2010/0187429 | A1* | 7/2010 | Engel ............... G01T 1/2928 250/370.09 |
| 2012/0133009 | A1 | 5/2012 | Sasaki |

OTHER PUBLICATIONS

International Search Report and Written Opinion received in PCT/US2011/047088, dated Mar. 14, 2012.

Kanatzidis et al., Dimensional Reduction in II-VI Materials: A2Cd3Q4 (A=K, Q=S, Se, Te; A=Rb, Q=S, Se), Novel Ternary Low-Dimensional Cadmium Chalcogenides Produced by Incorporation of A2Q in CdQ, Chem. Eur. J., vol. 2, No. 6, Jun. 1996, pp. 656-666.

Li et al., Rb2Hg3Te4: A New Layered Compound Synthesized from Solvothermal Reactions, Inorg. Chem., vol. 36, No. 4, Feb. 12, 1997, pp. 684-687.

Bugaris et al., Dicaesium hexamercury heptasulfide, Acta Crystallographica Section E64, Aug. 9, 2008.

Klintenberg et al., Potential scintillators identified by electronic structure calculations, Nuclear Instruments and Methods in Physics Research A, vol. 486, Apr. 12, 2002, pp. 298-302.

Ammlung et al., Ammlung et al., Conductivity and Raman Spectroscopy of New Indium(I) and Thallium(I) Ionic Conductors. In4CdI6, In2ZnI4,, and Tl2ZnI4, and the Related Compound Tl4CdI6, Journal of Solid State Chemistry, vol. 21, No. 3, Jul. 1977, pp. 185-193., Journal of Solid State Chemistry, vol. 21, No. 3, Jul. 1977, pp. 185-193.

Nagase et al., Electrical Conductivity and Thallium Spin-Lattice Relaxation Time Measurements of Tl4HgBr6 and Tl4HgI6, Bull. Chem. Soc. Jpn., vol. 63, No. 11, Nov. 1990, pp. 3329-3330.

Hoyer et al., Z Anorg Allg Chem, 587, 1990, pp. 23, English Abstract.

Poudeu et al., The intergrowth structure of Ag1.2Bi17.6S23Cl8 and its relation to the tubular structure of Bi6+dS6+3dCl6☐ 3d and the pavonite homologue Ag3xBi5☐ 3xS8☐ 6xCl6x☐ 1, Journal of Solid State Chemistry, vol. 179, Jul. 27, 2006, pp. 3636-3644.

Yamane et al., Mechanochemical synthesis and order-disorder phase transition in fluoride ion conductor RbPbF3, Solid State Ionics, vol. 179, Jun. 11, 2008, pp. 605-610.

Ibanez et al., Revue De Chimie Minerale, 23, 1986, pp. 281, English language Abstract.

Kanatzidis , New directions in synthetic solid state chemistry: chalcophosphate salt fluxes for discovery of new multinary solids, Current Opinion in Solid State & Materials Science, vol. 2, No. 2, Apr. 1997, pp. 139-149.

Narducci et al., Syntheses, crystal structures, and band gaps of Cs2Cd3Te4 and Rb2Cd3Te4 , Journal of Alloys and Compounds, vol. 306, Jun. 13, 2000, pp. 170-174.

Ibanez et al., Growth, Electrical and Photoelectrical Properties of Tl3SbS3 Single Crystal, Mat. Res. Bull., vol. 20, No. 8, Aug. 1985, pp. 921-927.

Owens, Semiconductor materials and radiation detection, J. Synchrotron Rad., vol. 13, Feb. 17, 2006, pp. 143-150.

Beun et al., Optical and Electrical Properties of Ternary Chalcogenides, Physica, 27, 1961, pp. 448-452.

Beun et al., Photoconductivity in Ternary Sulfides, Physica, 26, 1960, pp. 647-649.

Tagiev et al., Special Features of Charge Transport in PbGa2Se4 Crystals, Semiconductors, vol. 36, No. 3, 2002, pp. 273-275.

Loken et al., Tl2Au4S3: x=⅓ member of the series A2-xAuxQ. Preparation and an analysis of its gold-gold bonding, Chem. Commun., No. 15, Jan. 1, 1998, pp. 1603-1604.

Luke et al.,Pocket-size CdZnTe gamma-ray spectrometer, Nuclear Science Symposium Conference Record, IEEE, Nov. 2004.

H.T. Shaban, Measurements of Transport properties of TlGaSe2, Materials Chemistry and Physics 119, 2010, pp. 131-134.

International Search Report and Written Opinion received in PCT/US2016/035183, dated Jan. 27, 2017.

Mys et al., On the acoustooptic efficiency of Pb2P2Se6 crystals. Acoustic and thermal studies, Ukranian journal of Physical Optics, vol. 13, Issue 4, (2012), pp. 177-182.

Gerzanich, Optical properties of $A_2^{IV}B_2^VC_6^{VI}$ ferroelectrics-semiconductors: the effect of temperature and hydrostatic pressure, Ukrainian Journal of Physical Optics, vol. 9, Issue 3, (2008), pp. 129-163.

Wang et al., Refined Synthesis and Crystal Growth of Pb2P2Se6 for Hard Radiation Detectors, Crystal Growth & Design, vol. 16, Issue 9, Jul. 26, 2016, pp. 5100-5109.

Kostina et al., Charge Transport Mechanisms in a Pb2P2Se6 Semiconductor, ACS Photonics, vol. 3, Issue 10, Aug. 29, 2016, pp. 1877-1887.

Martynyuk-Lototska et al., Highly efficient acousto-optic diffraction in Sn2P2S6 crystals, Applied Optics, vol. 47, Issue 1, Jan. 1, 2008, pp. 52-55.

Androulakis et al., Dimensional Reduction: A Design Tool for New Radiation Detection Materials, Adv. Mater. 23, Aug. 9, 2011, pp. 4163-4167.

Liu et al., Photo-Induced Current Transient Spectroscopy of Semi-insulating Single Crystal Cs2Hg6S7, J. Electron. Mater. 44, 2015, pp. 222-226.

Li et al., Investigation of Semi-Insulating Cs2Hg6S7 and Cs2Hg6—xCdxS7 Alloy for Hard Radiation Detection, Cryst. Growth Des. 14, Sep. 23, 2014, pp. 5949-5956.

Peters et al., Investigation of defect levels in Cs2Hg6S7 single crystals by photoconductivity and photoluminescence spectroscopies, J. Appl. Phys. 112, Sep. 19, 2012, 063702-1-063702-6.

Im et al., Formation of native defects in the c-ray detector material Cs2Hg6S7, Appl. Phys. Lett. 101, Nov. 13, 2012, pp. 202103-1-202103-4.

Li et al., Crystal Growth and Characterization of the X-ray and γ-ray Detector Material Cs2Hg6S7, Cryst. Growth Des. 12, May 9, 2012, pp. 3250-3256.

Wibowo et al., Photoconductivity in the Chalcohalide Semiconductor, SbSeI: a New Candidate for Hard Radiation Detection, Inorg. Chem. 52, May 28, 2013, pp. 7045-7050.

Wang et al., Hard Radiation Detection from the Selenophosphate Pb2P2Se6, Adv. Funct. Mater. 25, Jul. 2, 2015, pp. 4874-4881.

Nguyen et al., Photoconductivity in Tl6SI4: A Novel Semiconductor for Hard Radiation Detection Chem. Mater. 25, Jul. 8, 2013, pp. 2868-2877.

Clark et al., Polarization-selective three-photon absorption and subsequent photoluminescence in CsPbBr3 single crystal at room temperature, Phys. Rev. B 93, May 5, 2016, pp. 195202-1-195202-8.

Stoumpos et al., Crystal Growth of the Perovskite Semiconductor CsPbBr3: A New Material for High-Energy Radiation Detection, Cryst. Growth Des. 13, Jun. 3, 2013, pp. 2722-2727.

Kostina et al., Photoluminescence fatigue and inhomogeneous line broadening in semiinsulating Tl6SeI4 single crystals, Semicond. Sci. Technol. 31, Apr. 14, 2016.

Johnsen et al., Thallium Chalcogenide-Based Wide-Band-Gap Semiconductors: TlGaSe2 for Radiation Detectors, Chem. Mater. 23, May 31, 2011, pp. 3120-3128.

Bannerjee et al., New Layered Tin(II) Thiophosphates ASnPS4 (A=K, Rb, Cs): Synthesis, Structure, Glass Formation, and the Modulated CsSnPS4, Inorg. Chem. 51, Oct. 9, 2012, pp. 11562-11573.

(56) References Cited

OTHER PUBLICATIONS

Gave et al., On the Lamellar Compounds CuBiP2Se6, AgBiP2Se6 and AgBiP2S6. Antiferroelectric Phase Transitions Due to Cooperative Cu+ and Bi3+ Ion Motion, Inorg. Chem. 44, (2005), pp. 5293-5303.

Johnsen et al., Thallium Chalcohalides for X-ray and γ-ray Detection, J. Am. Chem. Soc., 133, Jun. 15, 2011, pp. 10030-10033.

Carpentier et al., Vapour Growth and Crystal Data of the Thio(Seleno)-Hypodiphosphates Sn2P2S6, Sn2P2Se 6, Pb2P2S 6, Pb2P2Se6 and Their Mixed Crystals, Materials Research Bulletin, vol. 9, (1974), pp. 401-410.

G. Bartlett, Phosphorus Assay in Column Chromatography, J. Biol. Chem., vol. 234, No. 3, (1959), pp. 466-468.

Cullis et al., The Polymorphic Phase Behaviour of Phosphatidylethanolamines of Natural and Synthetic Origin, Biochimica et Biophysica Acta, 513, (1978), pp. 31-42.

Drouvalakis et al., Microtitre Plate and Assay Buffer Alter Detection of Antiphosphatidylethanolamine Antibodies in Lupus Anticoagulant Positive Plasma, Thrombosis Research 94 (1999), pp. 205-212.

Chapter 7. Non-specific components, Fundamental Immunology (1989), W. Paul ed., 2nd ed. Raven Press, N.Y., pp. 63-69.

E. Harris, Syndrome of the Black Swan, British Journal of Rheumatology vol. XXVI No. 5, Oct. 1987, pp. 324-326.

Hudson et al., Engineered antibodies, Nature Medicine, vol. 9, No. 1, Jan. 2003, pp. 129-134.

McIntyre et al., Anti-phosphatidylethanolamine (aPE) Antibodies: a Survey, Journal of Autoimmunity 15, (2000), pp. 185-193.

Nayfe et al., Seronegative antiphospholipid syndrome, Rheumatology 52, Mar. 15, 2013, pp. 1358-1367.

Rodriguez-Garcia et al., Clinical manifestations of antiphospholipid syndrome (APS) with and without antiphospholipid antibodies (the so-called 'seronegative APS'), Ann Rheum Dis 71, Sep. 27, 2011, pp. 242-244.

M. Sanmarco, ELISA for antiphosphatidylethanolamine antibody detection: High impact of assay buffer on results, Journal of Immunological Methods 358, Apr. 9, 2010, pp. 9-16.

Staub et al., Anti-phosphatidylethanolamine antibody, thromboembolic events and the antiphospholipid syndrome, Autoimmunity Reviews 12, Jul. 13, 2012, pp. 230-234.

Wilson et al., International Consensus Statement on Preliminary Classification Criteria for Definite Antiphospholipid Syndrome, Arthritis & Rheumatism, vol. 42, No. 7, Jul. 1999, pp. 1309-1311.

Del Sordo et al., Progress in the Development of CdTe and CdZnTe Semiconductor Radiation Detectors for Astrophysical and Medical Applications, Sensors 9, May 12, 2009, pp. 3491-3526.

Arachchige et al., Mercouri G. Kanatzidis: Excellence and Innovations in Inorganic and Solid-State Chemistry, Inorg. Chem. 56, Jul. 27, 2017, pp. 7582-7597.

* cited by examiner

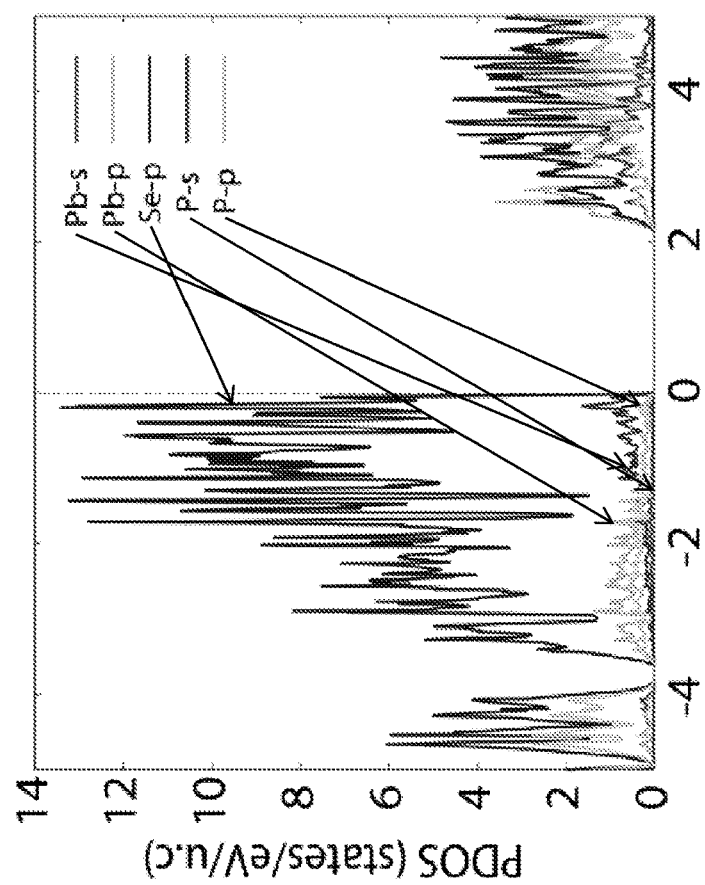
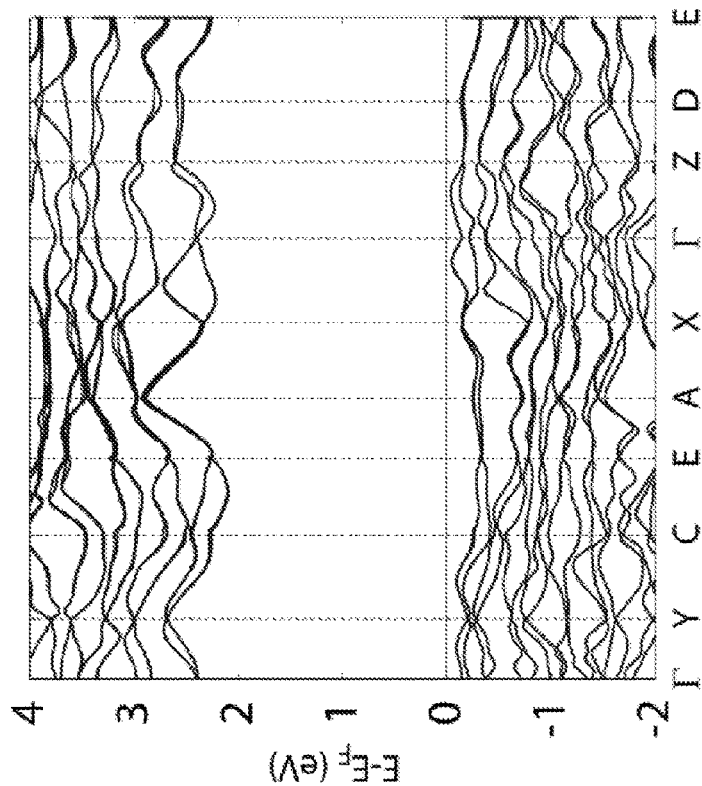
FIG. 5B
FIG. 5A

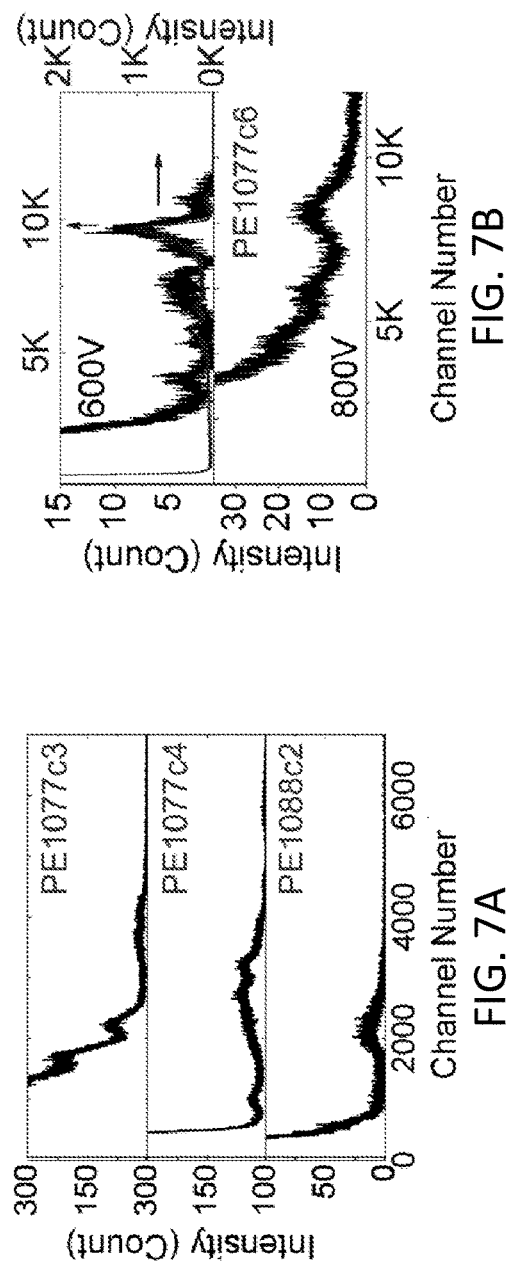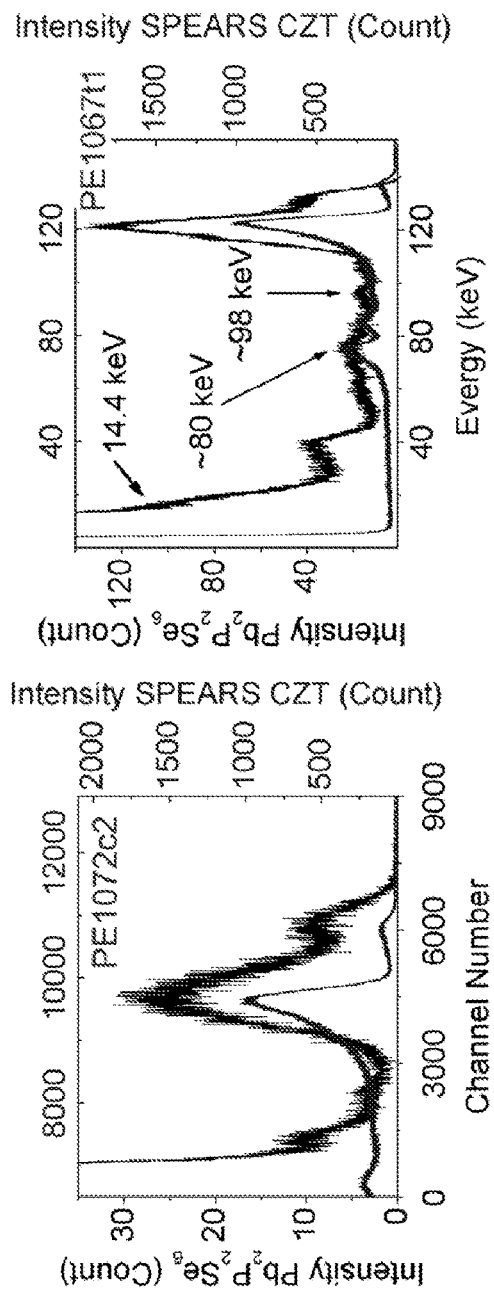
FIG. 7A  FIG. 7B  FIG. 7C  FIG. 7D ial patent application No. 62/170,237 that was filed

CHALCO-PHOSPHATE-BASED HARD RADIATION DETECTORS

CROSS-REFERENCE TO RELATED APPLICATIONS

The present application is a National Stage Entry of International Application No. PCT/US2016/035183 that was filed on Jun. 1, 2016, the entire contents of which are hereby incorporated by reference, which claims priority from U.S. provisional patent application No. 62/170,237 that was filed on Jun. 3, 2015, the entire contents of which are hereby incorporated by reference.

REFERENCE TO GOVERNMENT RIGHTS

This invention was made with government support under 2010-DN-077-AR1042 awarded by the Department of Homeland Security. The government has certain rights in the invention.

BACKGROUND

Room-temperature semiconducting X-ray and γ-ray detectors are crucial in a number of technologies, including biomedical imaging, national security and spectroscopy instrumentation; however, the high cost of commercial detectors has severely limited their broad application. Finding low cost room-temperature radiation detectors is a complex, multifaceted challenge. First of all, there is a limited number of potential detector materials due to the low availability of heavy element compounds possessing suitable optical band gaps (1.5~3.0 eV) and high resistivity. For example, the heavy chalcogenides, HgQ (Q=Se and Te), which are isostructural with CdTe and the rock salt PbQ, possess nearly zero or very narrow energy gaps. The second problem arises from the complex physics and chemistry of compound semiconductors in comparison to their elemental counterparts, such as Si and Ge. Third, many compounds with attractive bulk physical properties, such as α-HgS and TlI, exhibit phase transitions hindering the growth of high quality single crystals. For compounds suitable for crystal growth, e.g. the commercial benchmark $Cd_{0.9}Zn_{0.1}Te$ (CZT), the detector material suffers from stoichiometric imbalance and Te phase precipitation rooted in its intrinsic chemical properties, which have prevented its low cost production.

SUMMARY

Methods and devices for detecting the incident gamma and/or x-ray radiation are provided.

One embodiment of a method for the detection of gamma and/or x-ray radiation comprises the steps of: exposing a material comprising an inorganic compound having the formula $A_2P_2X_6$, where A represents Pb or Sn and X represents S or Se, to incident gamma radiation, x-ray radiation, or a combination thereof, wherein the material absorbs the incident radiation and electron-hole pairs are generated in the material; and measuring at least one of the energy or intensity of the absorbed incident radiation by detecting the generated electrons and/or holes.

One embodiment of a detector for gamma and/or x-ray radiation comprises: a material comprising an inorganic compound having the formula $A_2P_2X_6$, where A represents Pb or Sn and X represents S or Se; a first electrode in electrical communication with the material; a second electrode in electrical communication with the material, wherein the first and second electrodes are configured to apply an electric field across the material; and a detector configured to measure a signal generated by electron-hole pairs that are formed when the material is exposed to incident gamma radiation, x-ray radiation, or a combination thereof.

Also provided are single crystals of $Pb_2P_2Se_6$ having a surface area of at least 5 $mm^2$, wherein the single crystals do not contain any impurity at a concentration of greater than 2 ppm wt, other than impurities that are isoelectronic with Se or with Pb.

Other principal features and advantages of the invention will become apparent to those skilled in the art upon review of the following drawings, the detailed description, and the appended claims.

BRIEF DESCRIPTION OF THE DRAWINGS

Illustrative embodiments of the invention will hereafter be described with reference to the accompanying drawings.

FIG. 5A. Electronic band structure of $Pb_2P_2Se_6$ within the sX-LDA scheme. FIG. 5B. Projected partial density of states (PDOS).

FIG. 7A. Unresolved $^{57}Co$ γ-ray spectroscopic responses of $Pb_2P_2Se_6$ crystal samples. FIG. 7B. $^{57}Co$ γ-ray spectroscopic responses of a $Pb_2P_2Se_6$ single crystal wafer at 600V and 800V bias, compared to that of a SPEARS CZT detector. FIG. 7C. Partially resolved $^{57}Co$ γ-ray spectra of $Pb_2P_2Se_6$ crystals compared with that of a SPEAR detector (CZT), based on channel number. FIG. 7D. Partially resolved $^{57}Co$ γ-ray spectra of $Pb_2P_2Se_6$ crystals compared with that of a SPEAR detector (CZT), based on energy.

DETAILED DESCRIPTION

Methods and devices for detecting incident radiation, such as incident x-rays or gamma-rays, are provided. The methods and devices use high purity, high quality single-crystals of inorganic semiconductor compounds having the formula $A_2P_2X_6$, where A represents Pb or Sn and X represents S or Se, as photoelectric materials.

The compounds desirably have a band gap of at least 1.5 eV. This includes compounds having a band gap of at least 1.6 eV and further includes compounds having a bandgap of at least 1.8 eV. For example, in some embodiments the compounds have a band gap in the range from about 1.6 eV to about 3 eV. Methods of determining the bandgap of a material are described in the Examples.

Detector-grade materials comprising the compounds can be grown with high chemical purity and high crystal quality. For example, some embodiments of the materials do not contain any impurity element at a concentration of greater than 2 ppm wt., other than impurity elements that are isoelectronic with the A element or the X element in the inorganic compound. This includes embodiments of the materials that do not contain any impurity element at a concentration of greater than 1.5 ppm wt., other than impurity elements that are isoelectronic with the X element in the inorganic compound. Methods of making detector-grade materials are demonstrated in the Examples below, using $Pb_2P_2Q_6$ compounds as an illustration. The methods described in the Examples can be adapted to make detector-grade materials comprising the other inorganic semiconductor compounds, as well.

The high quality, low impurity nature of the compounds is reflected in their high electrical resistivities. For example, some embodiments of the compounds have an electrical resistivity at 23° C. of at least $10^9$ Ω·cm. This includes compounds having an electrical resistivity at 23° C. of at least $10^{10}$ Ω·cm and further includes compounds having an electrical resistivity at 23° C. of at least $10^{11}$ Ω·cm. Methods of determining the electrical resistivity of a material are described in the Examples.

In some embodiments of the methods and devices, the inorganic compound is a lead chalco-phosphate compound having the chemical formula $Pb_2P_2Q_6$ (where Q=S or Se) or its isostructural tin chalco-phosphates having the chemical formula $Sn_2P_2Q_6$ (where Q=S or Se).

Figure 1:
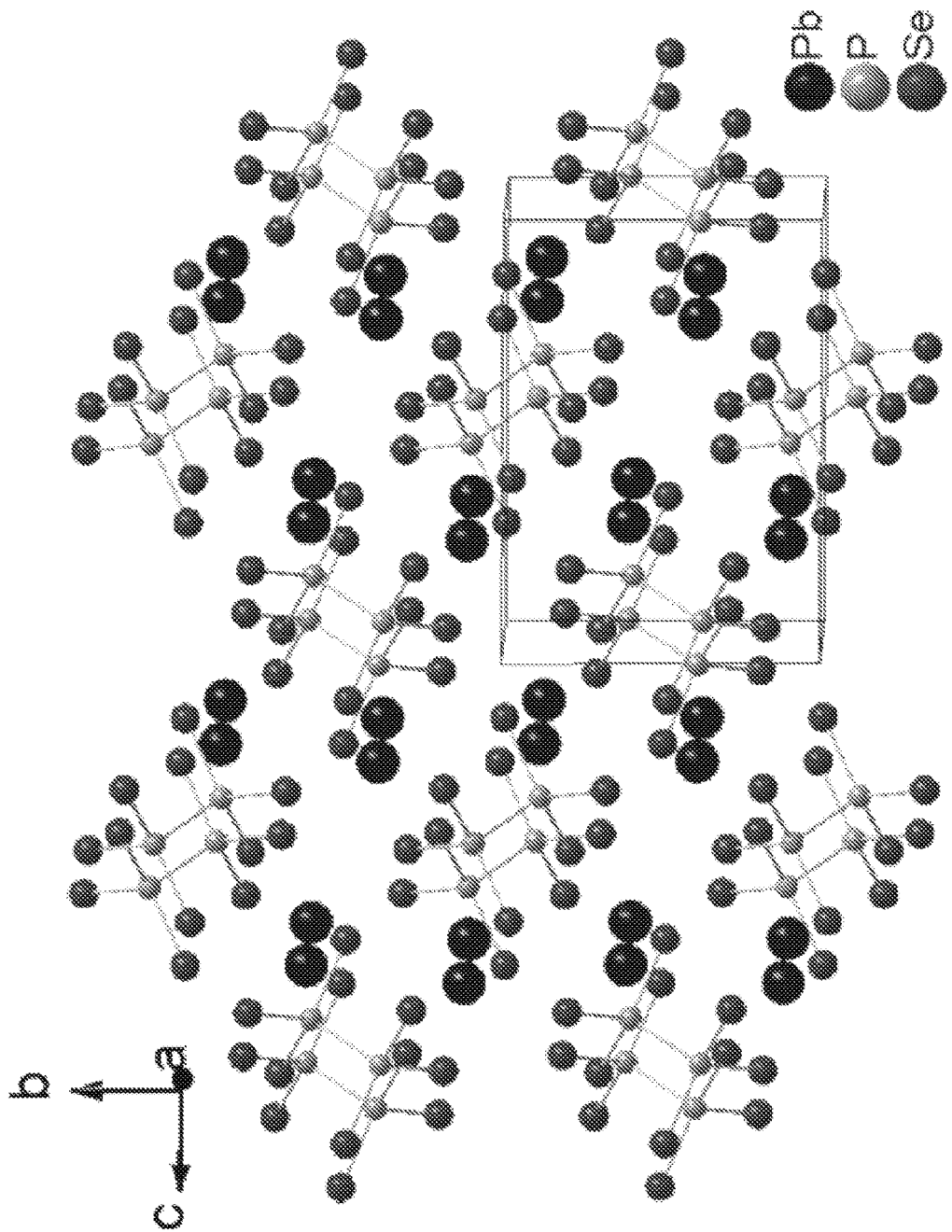
FIG. 1. Crystal structure of $Pb_2P_2Se_6$.

The two isostructural $Pb_2P_2Q_6$ compounds crystallize in the $P2_1/c$ space group with a=6.606 Å, b=7.464 Å, c=11.346 Å, β=124.10° for $Pb_2P_2S_6$ and a=6.910 Å, b=7.670 Å, c=11.816 Å, β=124.35° for $Pb_2P_2Se_6$. As illustrated in FIG. 1, the $Pb_2P_2Se_6$ is a salt of $Pb^{2+}$ cations with ethane-like $[P_2Se_6]^{4-}$ anions. The $Pb_2P_2S_6$ and $Pb_2P_2Se_6$ display yellow and dark red color, respectively, reflecting their large optical band gaps. Although both $Pb_2P_2S_6$ and $Pb_2P_2Se_6$ have attractive optical properties, the selenide with an average atomic number (Z) of 39.8 and a density of 6.14 g·cm$^{-3}$ is more suitable for high energy x-ray and γ-ray applications. The attenuation coefficient of $Pb_2P_2Se_6$ is greater than that of CZT, especially in the high energy region, which relaxes the requirement of high mobility-life time product (μτ) for an effective γ-ray detector. For example, for $^{137}Cs$ radiation at 662 keV, the attenuation length is 2.3 cm for CZT and only 1.8 cm for $Pb_2P_2Se_6$. In this case, the necessary distance for the charge carriers to travel to the electrodes is shorter in a $Pb_2P_2Se_6$ detector reducing the probability of trapping.

In addition to their bulk physical properties, another attractive feature of the present inorganic compounds as detector materials is their potential for low cost production. Compared to the commercial benchmark, CZT—an alloy of cadmium telluride and zinc telluride, the stoichiometric ternary compounds, $A_2P_2X_6$, with their simpler phase diagrams, have fewer technological and engineering challenges in terms of crystal growth and scale up development. More importantly, the elements in the compounds are abundant and widely used, while their robust chemical and physical properties allows them to be easily extracted, isolated and purified. The availability of high purity starting materials implies less complicated purification processes.

One aspect of the invention provides devices for the detection of incident radiation. In some embodiments the devices comprise: a material comprising an inorganic compound, of the type described herein, wherein the material is capable of absorbing incident radiation and generating electron-hole pairs; a first electrode in electrical communication with the material; and a second electrode in electrical communication with the material. In such devices the first and second electrodes are configured to apply an electric field across the material. The devices can further comprise one or more additional electronic components configured to measure a signal generated by the electron-hole pairs that form upon exposure of the material to the incident radiation. The incident radiation can comprise wavelengths in the gamma region of the electromagnetic spectrum (i.e., wavelengths in the range from about $1 \times 10^{-10}$ to about $2 \times 10^{-13}$ meters), in the x-ray region of the electromagnetic spectrum (i.e., wavelengths in the range from about 0.01 to 10 nanometers), or both.

Unless otherwise indicated, the quantitative chemical and physical properties recited herein refer the values of those properties at room temperature and atmospheric pressure.

EXAMPLES

Example 1. Basic Method of $Pb_2P_2Se_6$ Growth and Processing

This example demonstrates the crystal growth and optical and electrical properties, as well as the γ-ray response of $Pb_2P_2Se_6$ single crystals. Other physical properties of this compound, such as thermal behavior and mechanical properties are also discussed with respect to its utility as a low cost detector material.

Synthesis, Crystal Growth and Process

The $Pb_2P_2Se_6$ compound was prepared from as-purchased commercial elements without any further purification. The samples for exploratory crystal growth experiments and bulk physical property measurements (thermal, hardness) were prepared from lower purity starting materials (99.99%, wt), while the samples subjected to electrical measurements and gamma-ray detection tests were grown from high purity elements (99.999%+, wt). As starting materials, lead metal, red phosphorus and elemental selenium are chemically robust and physically stable substances, so they can be handled in the ambient environment. Although no additional purification was performed on the commercial starting materials, other than the removal of the surface oxide on the lead rods, great care was taken during the sample preparation to minimize the materials' exposure to possible sources of impurities, such as surfaces and containers. Following the same guideline, the synthesis and crystal growth of $Pb_2P_2Se_6$ were performed in one single ampoule to reduce the chance of contamination.

Figure 2:
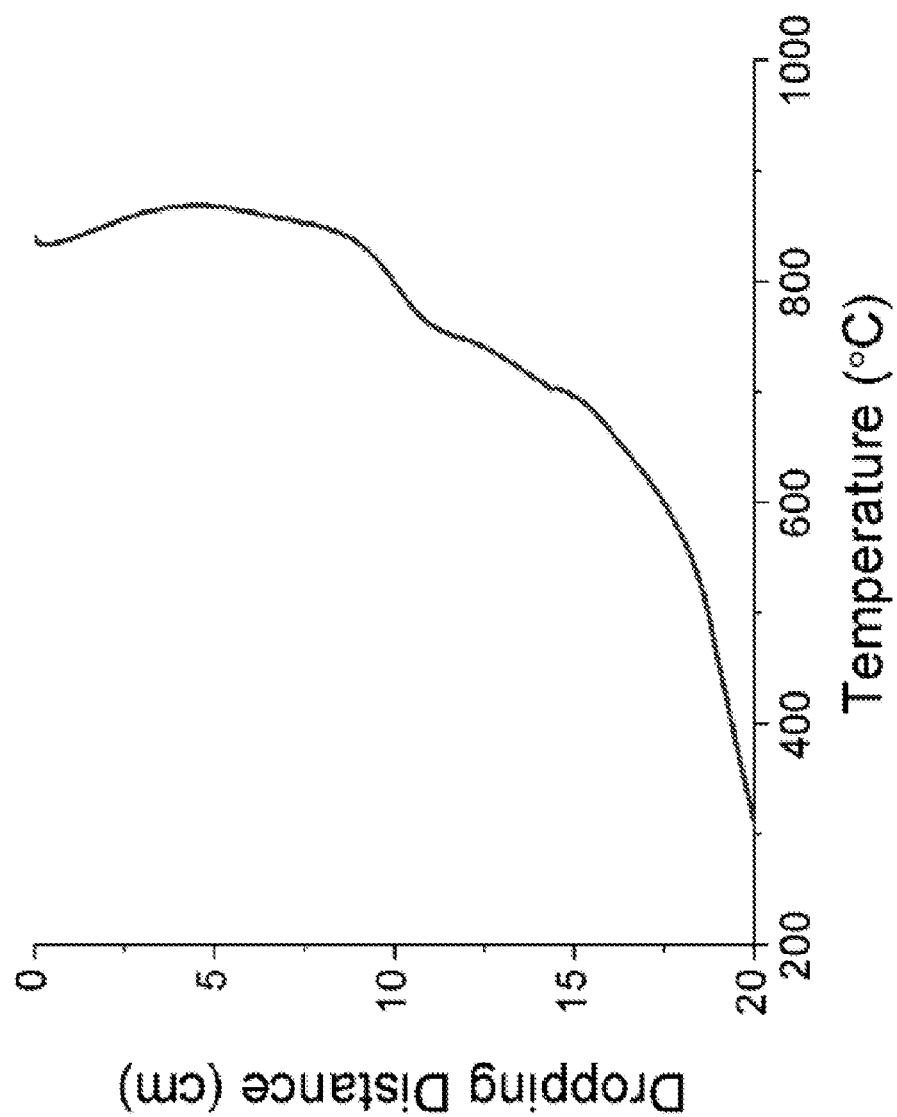
FIG. 2. Temperature profile of a furnace used in the crystal growth of $Pb_2P_2Se_6$ in Example 1.

Studies of $Pb_2P_2Se_6$ for other applications have demonstrated the growth of large single crystals by the Bridgman method. (See, I. Martynyuk-Lototska, O. Mys, B. Zapeka, M. Kostyrko, A. Grabar, R. Vlokh, *Appl. Opt.* 2014, 53, B103 and O. Mys, I. Martynyuk-Lototska, A. M. Kostruba, A. Grabar, R. Vlokh, *Ukr. J. Phys. Opt.* 2012, 13, 177.) The $Pb_2P_2Se_6$ compound exhibits a rather high melting point at 798° C., which creates a challenge for Bridgman crystal growth in terms of maintaining stable temperature zones. (See, I. P. Prits, M. V. Potorij, Y. V. Voroshilov, *Ukr. Khim. Zh.* 1989, 55, 135.) A high temperature two-zone furnace was selected for the Bridgman growth in order to achieve the desired temperature stability. Because of the relatively short zones of the furnace (hot and cold zones were 125 mm long), a large thermal stress was created when the bottom of the crystal started to quickly cool down as it moved out of the heated part of the cold zone (see FIG. 2 for the temperature profile). Such a situation is more pronounced when growing longer crystal ingots (>100 mm). The large thermal stress caused multiple cleavages perpendicular to the growth direction. These cleavages were spaced closer to the bottom of the ingot, indicating a greater temperature change towards the bottom of the furnace.

The above-discussed crystal growth process yielded sizable, crack-free segments of crystal ingots with good reproducibility. These ingots were subsequently cut and polished into detector samples. A $Pb_2P_2Se_6$ single crystal wafer less than 1 mm thick appeared transparent under intense incandescent light. When examined under polarized light, the sample exhibited uniform color change upon rotation, illustrating its single crystalline nature.

Thermal and Mechanical Properties

Figure 3C:
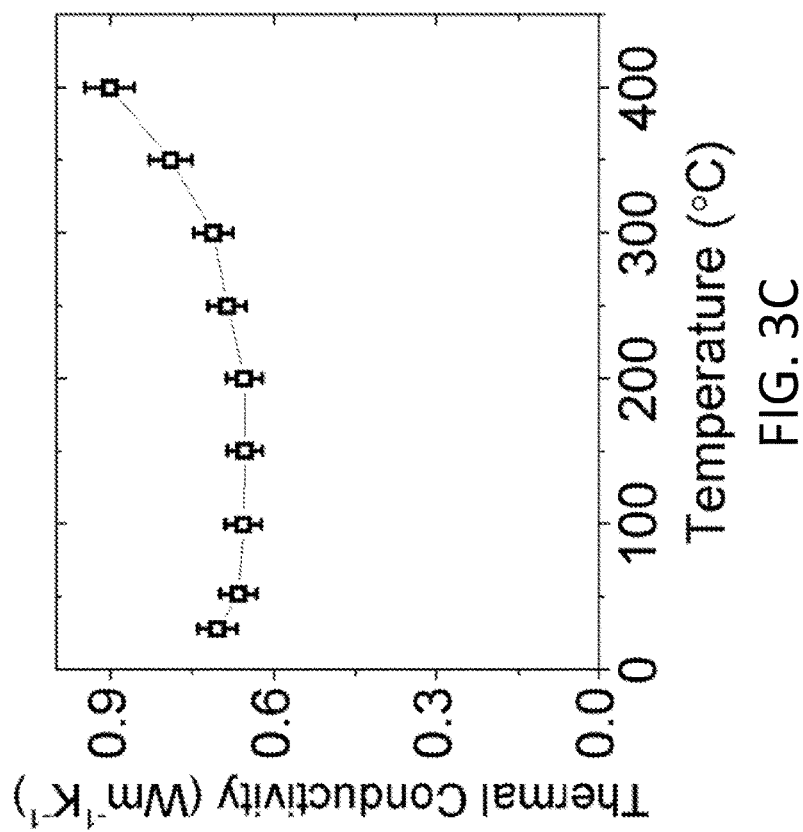
FIG. 3C. Thermal conductivity of $Pb_2P_2Se_6$ up to 400° C., measured at a rate 1° C./min.
Figure 3A:
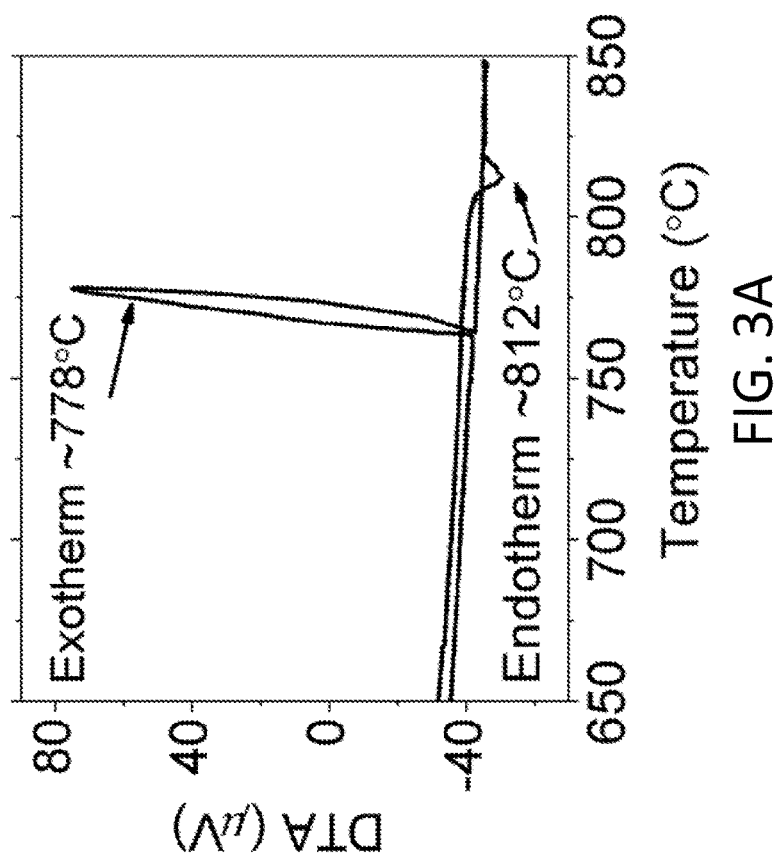
FIG. 3A. Differential thermal analysis of $Pb_2P_2Se_6$ between 650° C. and 850° C., measured at a rate 1° C./min.
Figure 3D:
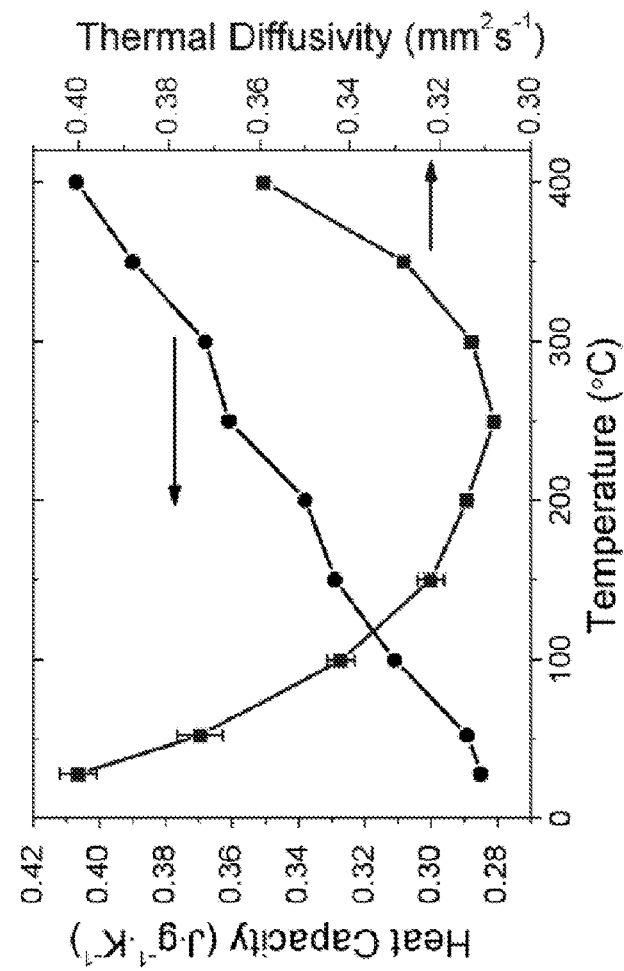
FIG. 3D. Heat capacity and thermal diffusivity of $Pb_2P_2Se_6$.
Figure 3B:
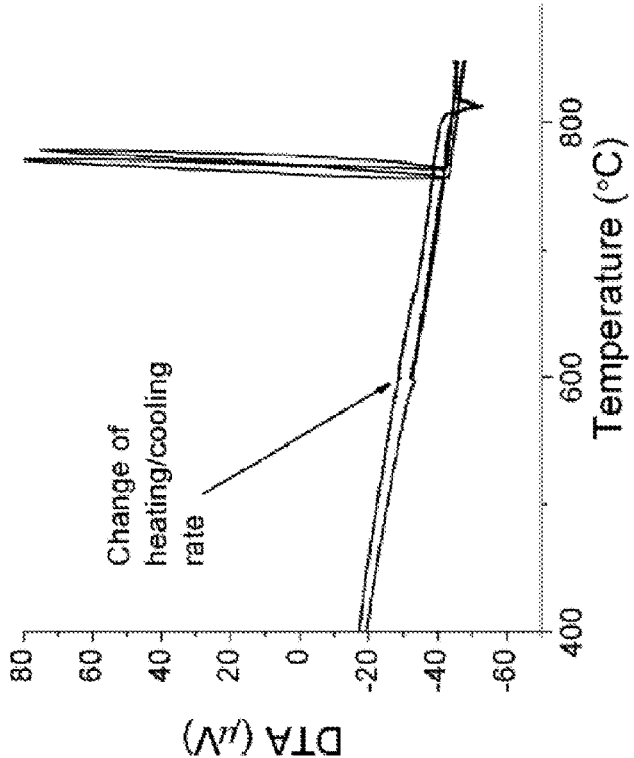
FIG. 3B. DTA analysis of $Pb_2P_2Se_6$ using two consecutive cycles of heating and cooling above 600° C.

Although the crystal growth technique was simple at this stage, it was able to produce sizable, high quality crystal ingots of $Pb_2P_2Se_6$ because of its well behaved thermal properties. The Differential Thermal Analysis (DTA) analysis performed on the polycrystalline $Pb_2P_2Se_6$ sample revealed only one endothermic peak at 812° C. and one exothermic peak at 778° C. (FIG. 3A), indicating a congruent melting behavior (see FIG. 3B for the full, two heat/cool cycle DTA analysis). The discrepancy between the DTA data and the reported melting point is likely caused by the fast heating and cooling rate (1° C./min) used during the DTA analysis. (See, I. P. Prits, M. V. Potorij, Y. V. Voroshilov, *Ukr. Khim. Zh.* 1989, 55, 135.) The intense and sharp exothermic peak observed at 778° C. implies the $Pb_2P_2Se_6$ system favors a highly crystalline form upon solidification. As a result, during the crystal growth process, a large amount of heat needs to be conducted away from the liquid-solid interface through the just-formed crystalline material.

The thermal conductivity of an as grown $Pb_2P_2Se_6$ single crystal along the growth direction was measured up to 400° C. (FIG. 3C, for heat capacity and thermal diffusivity see FIG. 3D). It is worth noting that the $Pb_2P_2Se_6$ exhibited an almost temperature-independent thermal conductivity between room temperature (i.e., ~23° C.) and 300° C., in agreement with earlier measurements. (See, V. M. Rizak, K. Al'-Shoufi, I. M. Rizak, I. P. Prits, Y. M. Vysochanskii, V. Y. Slivka, *Ferroelectrics* 1994, 155, 323.) At temperatures above 300° C., the thermal conductivity of $Pb_2P_2Se_6$ increased slightly with rising temperature. At 400° C., the thermal conductivity of $Pb_2P_2Se_6$ was $0.90\pm5$ $W \cdot m^{-1} \cdot k^{-1}$, which is comparable to that of CZT (1 $W \cdot m^{-1} \cdot K^{-1}$) and higher than that of TlBr (0.52 $W \cdot m^{-1} \cdot K^{-1}$). (See, M. E. Rodriguez, J. J. Alvarado-Gil, I. Delgadillo, O. Zelaya, H. Vargas, F. Sánchez-Sinencio, M. Tufiño-Velázquez, L. Baños, *Phys. Status Solidi A* 1996, 158, 67 and R. J. Gummow, I. Sigalas, *Int. J. Thermophys.* 1987, 8, 607.) With a further improved Bridgman technique, the higher thermal conductivity of $Pb_2P_2Se_6$ in combination with its congruent melting behavior promises better single crystal yield and faster growth speeds, which are highly desirable material attributes for cost-effective bulk crystal production.

Another attractive property of a $Pb_2P_2Se_6$ crystal is its mechanical hardness. For soft materials, waferization and mechanical polishing performed during detector fabrication could introduce more defects that deteriorate its performance. Micro-indentation measurements revealed a Knoop hardness of $106\pm3$ $kg \cdot mm^{-2}$ for $Pb_2P_2Se_6$, which is significantly harder than CZT (60-80 $kg \cdot mm^{-2}$) and TlBr (12 $kg \cdot mm^{-2}$). (See, A. Owens, A. Peacock, *Nucl. Instrum. Methods Phys. Res., Sect. A* 2004, 531, 18; S. Adachi, *Properties of Group-IV, III-V and II-VI Semiconductors*, John Wiley & Sons, Ltd, 2005 and A. V. Churilov, G. Ciampi, H. Kim, W. M. Higgins, L. J. Cirignano, F. Olschner, V. Biteman, M. Minchello, K. S. Shah, *J. Cryst. Growth* 2010, 312, 1221.) The superior hardness demonstrates that simpler post-growth processes and device fabrication methods can be implemented for the development of $Pb_2P_2Se_6$.

Optical Properties and Electronic Structure Calculations

Figure 4:
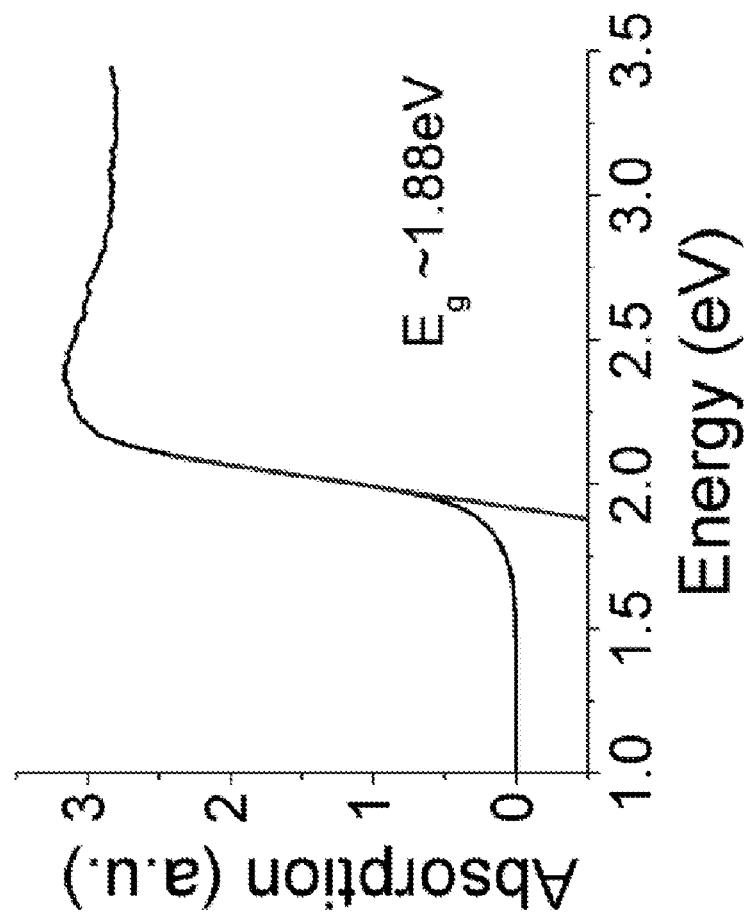
FIG. 4. Electronic absorption spectrum obtained from UV-Vis diffuse reflectance measurement on ground $Pb_2P_2Se_6$ crystals.

The optical band gap of $Pb_2P_2Se_6$ was determined to be 1.88 eV by UV-Vis diffuse reflectance spectroscopy using ground crystals (FIG. 4). (See, S. Johnsen, Z. Liu, J. A. Peters, J.-H. Song, S. Nguyen, C. D. Malliakas, H. Jin, A. J. Freeman, B. W. Wessels, M. G. Kanatzidis, *J. Am. Chem. Soc.* 2011, 133, 10030). The observed optical band gap of $Pb_2P_2Se_6$ was found in agreement with the ~2 eV indirect band gap predicted by the electronic structure calculations (FIG. 5A). Interestingly, the theoretical calculations also revealed dominant contributions of Pb and Se based orbitals to the density of state (DOS, FIG. 5B) at the vicinity of the Fermi level. Although the tetravalent phosphorus atoms play a limited role in the direct Pb—Se bonds, they produce strong covalent P—Se bonding in the $[P_2Se_6]^{4-}$ cluster, which in turn modulates Pb—Se bond strength to define the observed large band gap.

Electronic Transport and Detector Properties

The room temperature electrical resistivity of $Pb_2P_2Se_6$ was in the range of $1\times10^{10}$ $\Omega \cdot cm$. This value is comparable to CZT and well above the threshold requirement of $10^8$-$10^9$ Ω·cm for effective room temperature γ-ray detector materials. With such a high resistivity, a $Pb_2P_2Se_6$ detector is expected to exhibit low dark current, so that higher bias can be applied to increase detector resolution and decrease readout time.

Figure 6:
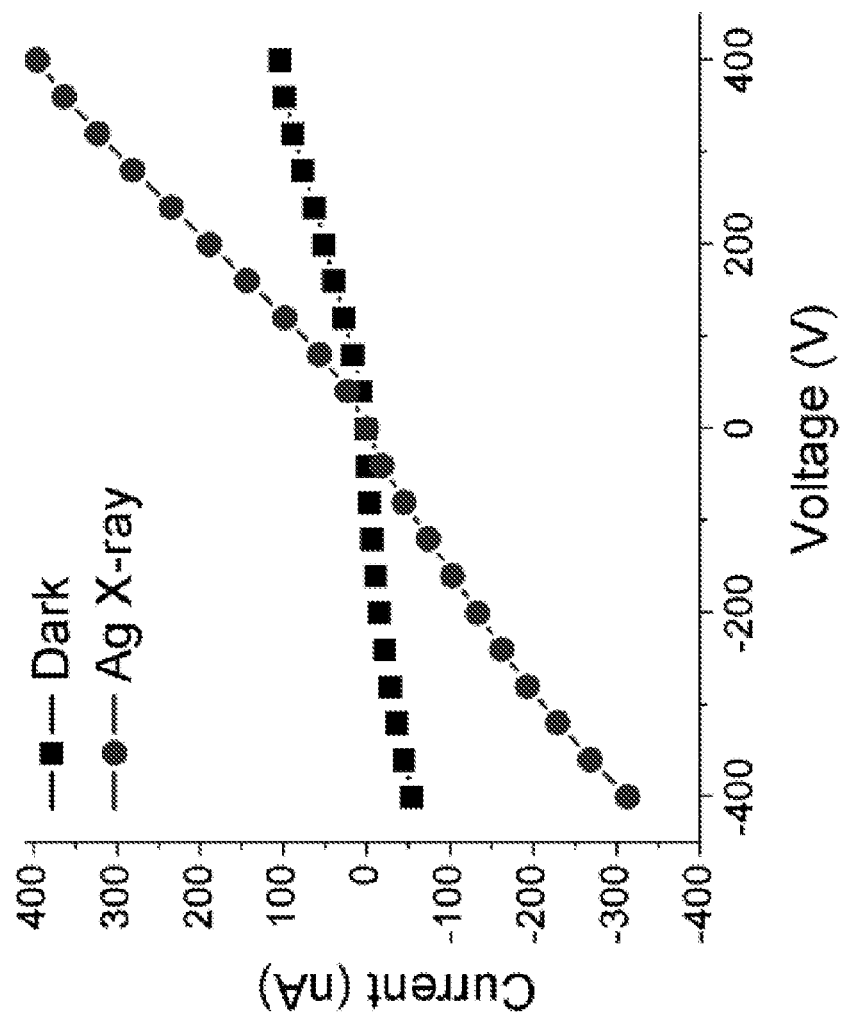
FIG. 6. Electrical resistivity of $Pb_2P_2Se_6$ with (circles) and without (squares) Ag x-ray.

In addition to the high resistivity, when the $Pb_2P_2Se_6$ samples were subjected to 40 kV/10 mA Ag X-ray radiation, they produced a threefold increase in current under a 400V bias (FIG. 6). This observation illustrates the good photoconductivity properties of $Pb_2P_2Se_6$ under hard radiation.

In terms of the detector performance, the $Pb_2P_2Se_6$ compound was still at a very early stage of development. The crystallinity and purity of the $Pb_2P_2Se_6$ samples can vary depending on their position in a multi cm long crystal ingot. In general, the tip part (first to solidify) of a Bridgman-grown crystal ingot exhibited lower crystallinity due to the competition between multiple seeds. The heel portion (last to solidify) of the same crystal ingot, on the other hand, retained more impurities. As a result, the spectroscopic performances of the extracted single crystal samples depended on their positions along the ingot. Nevertheless, it was found that $Pb_2P_2Se_6$ samples can exhibit spectroscopic responses under gamma-radiation (FIG. 7A), with resolvable spectroscopic features. FIG. 7B presents two pulse height spectra of $^{57}Co$ γ-radiation generated by a $Pb_2P_2Se_6$ single crystal wafer at 600V (top) and 800V (bottom) bias. At 600V, the $Pb_2P_2Se_6$ wafer produced a $^{57}Co$ γ-ray spectrum with resolved features that are comparable to those in a CZT-generated spectrum. At an increased bias of 800V, the spectrum from the same $Pb_2P_2Se_6$ sample became more convoluted, while a shift of peak maxima (position in detector channel number) could be observed, elucidating the sample's response to the change in bias voltage.

In addition to these responses, several $Pb_2P_2Se_6$ crystals were able to generate partially resolved $^{57}Co$ γ-ray spectra. FIGS. 7C and 7D demonstrate two pulse height of a $^{57}Co$ source which emits 14.4, 122.1, and 136.5 keV γ-rays with relative intensities of 0.11, 1, and 0.12, respectively. The spectrum in FIG. 7C shows two major peaks matching the 122.1, and 136.5 keV lines of the $^{57}Co$ spectrum from CZT, while other minor features were too weak to be identified. In FIG. 7D, the $Pb_2P_2Se_6$ sample resolved the main peak at and 122.1 keV with a resolution of ~10 keV FWHM. Due to the relatively low resolution, the 136.5 keV radiation was only partially resolved as a shoulder of the 122.1 keV signal. The typical Compton scattering feature at ~80 keV was also recorded and found to match those recorded by typical CZT detectors. (See, G. R. Gilmore, *Practical Gamma-Ray Spectrometry*, John Wiley & Sons, Ltd, 2008.) The small peak at ~98 keV could be attributed to the Pb atom escape line, which is intrinsic to the composition. The broad peak between 30 and 40 keV is believed to be related to a breakdown current formed under the large electric field, which also contributes to the high background at low energy. The 14.4 keV γ-radiation signal may be convoluted with the large background forming a broad shoulder feature.

The spectroscopic response at different applied voltages allowed for the evaluation of the mobility-lifetime products of electron carriers using a methodology developed by Ruzin et al., which employs a mollified Hecht equation (equation (a)). (See, A. Ruzin, Y. Nemirovsky, *J. Appl. Phys.* 1997, 82, 4166 and K. Hecht, *Z. Physik* 1932, 77, 235.) This method is based on spectroscopy measurements of the X- or γ-ray photons. The mobility-lifetime products for electrons was derived from the analysis of the maximal charge collection efficiency (CCE) under each bias voltage applied to the sample, specifically, the channel location that had the maximum photon counts under a given bias voltage. By varying the applied bias voltage V, the maximum response count channel Ch(V) varied accordingly. The charge collection efficiency (CCE) is linked to parameter V, the bias voltage applied to the sample as:

$$CCE(V) = \frac{Ch(V)}{Const} = \frac{\mu\tau V}{L^2}\left[1 - e^{\frac{L^2}{\mu\tau V}}\right], \quad (a)$$

where L (0.171 cm) is the thickness of the sample. With negative bias applied to the surface facing the radiation source, electron carriers were collected and the maximum response count channel under the 122.1 keV characteristic peak was recorded. By using the maximum centroid channel numbers Ch1 (9910) and Ch2 (12747) under the two bias voltages, V1=400 V, and V2=600 V, and equation (a), the estimated lifetime mobility product of the sample was $3.5\times10^{-5}$ $cm^2/V$ for electron carriers. Multiplying by the applied external electric field under 600 V bias, 600 V/0.171 cm=3509 V/cm, the drift length was estimated to be 1.23 mm under 600 V bias. Under 400 V bias, it was estimated to be 0.82 mm. The parameter Const is the maximum channel corresponding to the limit reachable, estimated to be 23,618. This method was tested by measuring a CZT sample under a $^{57}Co$ radiation source. The mobility lifetime product for electron carriers of the CZT sample (4×4×2 $mm^3$) from eV Products was measured using the same method. Two bias voltages, 200 V and 300 V, were used. The value was estimated to be $5.8\times10^{-3}$ $cm^2/V$, which is in good agreement with previous measurements.

Conclusion

The heavy metal chalco-phosphate, $Pb_2P_2Se_6$, is a suitable semiconductor for X-ray and/or γ-ray detectors. Here, procedures for bulk synthesis, crystal growth and sample processing have been described. Large single crystals of $Pb_2P_2Se_6$ with high resistivity were grown by vertical Bridgman method and subsequently waferized and processed for physical property measurements and γ-ray detector testing. The optical band gap of bulk $Pb_2P_2Se_6$ is 1.88 eV, and is indirect in nature as indicated by the electronic structure calculations. The $Pb_2P_2Se_6$ crystal samples exhibited relatively low mobility-lifetime products, but despite this, they exhibited good photo-current response towards 40 keV Ag X-ray and were able to produce a resolved $^{57}Co$ γ-ray spectrum.

The $Pb_2P_2Se_6$ compound is a useful cost-effective hard radiation detector material because of its robust chemical and physical properties. The availability and stability of the starting materials allows for a simple preparation of functioning detector samples. Its thermal behavior implies less technological and engineering challenges in terms of crystal growth and scale up. Finally, the good mechanical hardness of $Pb_2P_2Se_6$ enables easy adaption to existing post-growth processes and detector fabrication techniques Experimental Section Synthesis and Crystal Growth:

Polycrystalline samples of $Pb_2P_2Se_6$ were prepared from lead metal (rod, Alfa Aesar, various purity), selenium (shots, Alfa Aesar, various purity) and red phosphorous (pieces, Alfa Aesar, various purity). During the sample preparation, lead metal was etched with 5% $HNO_3$ solution then rinsed with pure ethanol in order to remove the surface oxide. Sixty grams of stoichiometric starting materials were loaded into tapered fused silica ampoules (13 mm ID, 1 mm wall thickness and 200 mm in length) and sealed under vacuum ($\sim 10^{-4}$ Torr). The samples were heated to 950° C. over 72 hours and held at the maximum temperature for 12 hours before they were cooled to room temperature over 12 hours.

Figure 8:
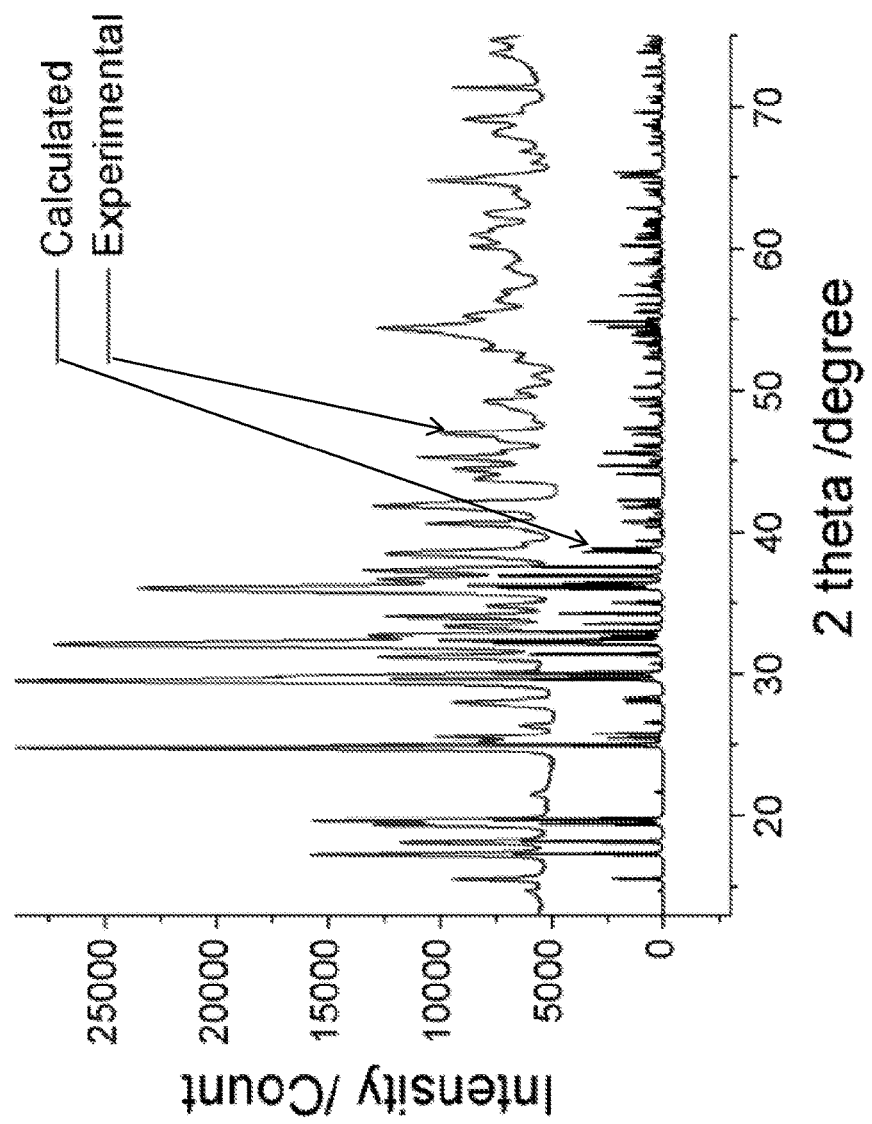
FIG. 8. Experimental powder X-ray diffraction pattern of $Pb_2P_2Se_6$ compared to a simulated pattern.

The as obtained polycrystalline samples, with their original silica ampoules intact, were subsequently used for single crystal growth in a modified vertical two-zone Bridgman furnace equipped with a geared dropping mechanism. The temperature of the hot zone was 850° C., while the cold zone was 650° C. The crystal growth was carried out with a lowering rate of 0.5 mm per hour. Once the samples were completely lowered into the cold zone, they were annealed in situ at 650° C. for 24. Finally, the grown crystals were cooled to room temperature over 24 hours. The temperature gradient in the two-zone Bridgman furnace was estimated to be 30° C./cm. Segmented crystal ingots were obtained from the crystal growth. The solid crystal ingots naturally fracture in the direction perpendicular to the thermal gradient, forming smaller segments toward the tip of the tapered ampoule and largest segments (up to 25 mm long) at the heel part. The compositions and phase purity of the $Pb_2P_2Se_6$ crystals were verified by powder X-ray diffraction (FIG. 8).

X-Ray Diffraction Studies:

X-ray powder diffraction experiments were conducted on a silicon-calibrated CPS 120 Inel powder X-ray diffractometer with Cu $K_{\alpha 1}$ radiation. The data were collected in an angular range of 0-120° 2θ with a scan step 0.029°. Experimental powder XRD patterns were compared to the simulated diffraction pattern based on the reported the single crystal structure. (See, H. Yun, J. A. Ibers, *Acta Crystallogr., Sect. C: Cryst. Struct. Commun.* 1987, 43, 2002.) The powder XRD patterns showed good agreement with the calculated XRD patterns from the single crystal models. To verify the crystal structure, single-crystal X-ray diffraction was performed at 298(2) K on extracted $Pb_2P_2Se_6$ single crystals with a Stoe image plate diffraction system (IPDS) II diffractometer using graphite-monochromated Mo Kα radiation (λ=0.71073). Data process and numerical absorption corrections were performed using Stoe X-Area software. (See, STOE & Cie GmbH, Darmstadt 2006.) Structures were solved by direct methods and refined by full-matrix least-squares on $F^2$ (all data) using the SHELXTL software suite. (See, G. M. Sheldrick, University of Göttingen, Göttingen, Germany 1997.) The crystallographic and structural information is summarized in Tables 1, 2 and 3.

TABLE 1

Crystallographic refinement data for $Pb_2P_2Se_6$ at 298(2) K

| | |
|---|---|
| Formula | $Pb_2P_2Se_6$ |
| Formula Mass (amu) | 950.08 |
| Space group | $P2_1/c$ |
| a (Å) | a = 6.902(1) |
| b (Å) | b = 7.655(2) |
| c (Å) | c = 11.791(3) |
| a (°) | 90 |
| b (°) | 124.33(2) |
| g (°) | 90 |
| Volume (Å$^3$) | 514.4(2) |
| Z | 2 |
| Crystal size (mm) | 0.20 × 0.18 × 0.15 |
| ρ (calculated) (g/cm$^3$) | 6.134 |
| Absorption coefficient (mm$^{-1}$) | 54.153 |
| F(000) | 796 |
| θ (deg) | 3.98-33.40 |
| Index ranges | $-10 \leq h \leq 10$, $-11 \leq k \leq 11$, $-18 \leq l \leq 18$ |
| Reflections collected | 9916 |
| $R_{int}$ | 0.0826 |
| Independent reflections | 1980 |
| Completeness to θ = 33.40° | 99.2% |
| Data/Restraints/Parameters | 1980/0/46 |
| GOF on $F^2$ | 1.184 |
| R/wR (I > 2σ(I)) | 0.0494/0.0829 |
| R/wR (all data) | 0.0658/0.0868 |
| Largest diff peak and hole (e.Å$^{-3}$) | 1.564 and −2.714 |

TABLE 2

Atomic positions and isotropic displacement factors for $Pb_2P_2Se_6$.

| Atom | x | y | z | Wyckoff | $U_{eq}$(Å$^2$) | Occupancy |
|---|---|---|---|---|---|---|
| Pb | 0.28642(7) | 0.38694(5) | 0.24862(4) | 4e | 0.0249(1) | 1 |
| Se1 | 0.1272(2) | 0.0027(1) | 0.23349(8) | 4e | 0.0137(2) | 1 |
| Se2 | 0.2193(2) | 0.7020(1) | 0.04232(8) | 4e | 0.0142(2) | 1 |
| Se2 | 0.3883(2) | 0.1925(1) | 0.05433(8) | 4e | 0.0158(2) | 1 |
| P | 0.6227(4) | 0.39246(3) | 0.06340(2) | 4e | 0.0105(3) | 1 |

TABLE 3

Selected Bond Lengths (Å) and Angles (°) for $Pb_2P_2Se_6$.

| Atoms | Value |
|---|---|
| Bond Lengths | |
| Pb—Se | 3.108(1) |
| | 3.109(1) |
| | 3.127(1) |
| | 3.166(1) |
| | 3.199(1) |
| | 3.268(1) |
| P—P | 2.227(4) |
| P—Se | 2.190(2) |
| | 2.185(2) |
| | 2.183(2) |
| Angles | |
| Se—P—Se | 115.46(9) |
| | 114.4(1) |
| | 109.45(9) |
| Se—P—P | 106.4(1) |
| | 102.9(1) |
| | 107.3(1) |

Waferization and Polishing:

The larger $Pb_2P_2Se_6$ crystal segments were cut into wafers of 1-2 mm thick in the direction perpendicular to the growth direction using a Struers Accutom-50 waferizing saw equipped with a 300 μm wide diamond-impregnated blade. The sample surface was polished by hand with successively finer grit SiC grinding papers up to 3 μm particle size. Then the fine polishing was achieved mechanically with 0.05 μm suspended Al$_2$O$_3$ slurry. After polishing, the processed Pb$_2$P$_2$Se$_6$ crystals exhibited mirror like smooth surfaces. The processed samples were usually irregular shaped due to fracturing occurred during polishing. The average surface area of the wafers ranged from 3 mm×3 mm up to 5 mm×10 mm, while the thickness varied between 1 mm to 2 mm.

Differential Thermal Analysis:

Differential thermal analysis (DTA) was performed on a Shimadzu DTA-50 thermal analyzer. Around 20 mg of ground crystalline samples were sealed in a fused silica ampoule under vacuum. A similar amount of α-Al$_2$O$_3$ powder sealed in a separated ampoule was used as a reference. The samples were heated and cooled to a maximum temperature of 900° C. A heating/cooling rate of 5° C./min was used up to 600° C., while a slower rate of 1° C./min was used between 600° C. to 900° C. The melting and crystallization points were taken as the temperatures of the endothermic and exothermic peaks, respectively.

Optical Characterization:

In order to determine the optical band gap of Pb$_2$P$_2$Se$_6$, optical diffuse reflectance measurements were employed. The measurements were performed at room temperature using a Shimadzu UV-3101-PC double-beam, double-monochromator spectrophotometer. Data were collected in the range of 200-2500 nm with BaSO$_4$ as a 100% reflectance standard. The finely ground crystalline sample was spread on a compacted substrate of BaSO$_4$ powder. The generated reflectance versus wavelength data was converted to absorbance data using the Kubelka-Munk equation so the optical band gap can be estimated. (See, S. P. Tandon, J. P. Gupta, *Phys. Status Solidi B* 1970, 38, 363.)

Thermal Conductivity:

A selected single crystal wafer (6 mm×6 mm×2 mm) was subjected to thermal conductivity measurement. A thin layer of graphite coating was applied to the sample to minimize errors from the emissivity of the material. Total thermal conductivity, κ, was calculated using the following equation:

$$\kappa = \alpha C_p d, \quad (b)$$

where α, $C_p$ and d are the thermal diffusivity coefficient, the specific heat and the density, respectively. The thermal diffusivity coefficient (α) was measured using the laser flash diffusivity method in a Netzsch LFA457 Laser Flash Apparatus, while the specific heat capacity ($C_p$) of Pb$_2$P$_2$Se$_6$ was indirectly derived using a standard (Pyroceram 9606) in the range of 300-673K. A Cowan model with pulse correction was applied to the analysis of the thermal diffusivity data, where cooling cycles gave reproducible values for each sample.

Hardness Measurements:

A Pb$_2$P$_2$Se$_6$ single crystal was analyzed via the microindentation measurements using a Struers Duramin 5 automated micro hardness tester equipped with a Knoop tip. Indentations were made with a 25 g load for 5 seconds at random locations on the surface of a fine polished Pb$_2$P$_2$Se$_6$ crystal wafer. The indentations were subsequently evaluated using a calibrated, built-in high resolution microscope to extract the Knoop hardness values for each indentation trace. (See, F. Knoop, C. G. Peters, W. B. Emerson, *J. Res. Natl. Bur. Stand.* (*U.S.*) 1939, 23, 39.)

Transport and Detector Property Measurements:

Direct current resistivity was measured in the dark using a Keithley 6517b electrometer. Colloidal graphite paint was used to connect copper wires to the surfaces of the Pb$_2$P$_2$Se$_6$ wafer samples. During the measurements, the voltage was swept from −400V to 400V with a dwell time of 30 s. Photoconductivity was measured in parallel with an Ag X-ray tube source (40 kV, 10 mA) illuminating the sample.

For the detector property measurement, Pb$_2$P$_2$Se$_6$ single crystal wafers 1-2 mm thick were exposed to a 1.0 mCi $^{57}$Co source. In each measurement, the sample was placed in an eV-480 test fixture which was connected to an eV-550 preamplifier box. A positive bias between 400V and 800 V was applied to a crystal wafer to maintain an electric field up to ~8×10$^5$ Vm$^{-1}$. A SPEAR detector with a 5×5×5 mm CZT crystal was used as a reference and it was operated at a bias voltage of 1000 V. For the Pb$_2$P$_2$Se$_6$ samples, the signals were transferred to an ORTEC amplifier (Model 572A) with a gain of 200-1000 and shaping time of 0.5-6 μs, while the signal from the commercial CZT detector was amplified with a gain of 1000 and shaping time of 0.5 μs. The processed signals was subsequently evaluated by a dual 16 K input multichannel analyzer (Model ASPEC-927) and read into the MAESTRO-32 software. The detailed measurement parameters are summarized in Table 4, with respect to the spectra in FIGS. 7A-7D.

TABLE 4

$^{57}$Co gamma-ray measurement parameters with respect to the spectra in FIGS. 7A-D.

| Sample code | Thickness (mm) | Voltage (V) | Polarity | Gain | Shaping Time (μs) | Collection Time (s) |
|---|---|---|---|---|---|---|
| PE1077c3 | 1.5 | 400 | Positive | 1000 | 6 | 400 |
| PE1077c4 | 1.5 | 400 | | 1000 | 6 | 8000 |
| PE1088c2 | 1.1 | 800 | | 200 | 6 | 1000 |
| PE1077c6 | 1.8 | 600-800 | | 1000 | 6 | 7500 |
| PE1072c2 | 1.3 | 400 | | 1000 | 6 | 30 |
| PE1067t1 | 1.7 | 600 | | 1000 | 6 | 4000 |

Electronic Structure Calculations:

The electronic band structure of Pb$_2$P$_2$Se$_6$ was determined using the projector augmented wave method as implemented in the Vienna Ab initio Simulation Package. (See, P. E. Blochl, *Phys. Rev. B: Condens. Matter Mater. Phys.* 1994, 50, 17953; G. Kresse, J. Hafner, *Phys. Rev. B: Condens. Matter Mater. Phys.* 1993, 47, 558 and G. Kresse, J. Furthmüller, *Physical Review B* 1996, 54, 11169.) Energy cut off for the plane wave basis was set to 350 eV and the 5×5×3 Monkhorst-Pack grid was used for momentum space integrations in a self-consistent calculation. (See, H. J. Monkhorst, J. D. Pack, *Phys. Rev. B: Condens. Matter Mater. Phys.* 1976, 13, 5188.) In order to predict a band gap correctly, the hybrid functional was employed within the Heyd-Scuseria-Ernzerhof formalism. (See, J. Heyd, G. E. Scuseria, M. Ernzerhof, *J. Chem. Phys.* 2003, 118, 8207.) Spin-orbit coupling was included in a non-collinear scheme.

Example 2. Enhanced Method of $Pb_2P_2Se_6$ Growth and Processing

In order to further develop the $Pb_2P_2Se_6$ as a hard radiation detector, it was desirable to improve the reproducibility of the detector material quality. For instance, a higher phase uniformity within an ingot enables the study of the distributions of impurities, defects, and secondary phases along the growth direction. In addition, better reproducibility across the growth runs would result in identification of the crucial processes affecting the final sample quality. This example reports refined synthesis, crystal growth and post-growth processes developed to produce $Pb_2P_2Se_6$ with improved electrical and optical properties, as well as reproducible responses to γ-ray radiation. The impact of stoichiometry control on the optical and electrical properties of the detector samples was elucidated by a series of comparative measurements.

Synthesis and Crystal Growth

The $Pb_2P_2Se_6$ samples were synthesized from lead metal (rod, Alfa Aesar, 99.9999% wt.), selenium (pellets, Stanford Advanced Materials, 99.99999% wt.) and red phosphorous (pieces, Alfa Aesar, 99.999% wt.). The as-purchased lead was etched with 5% $HNO_3$ solution then rinsed with pure ethanol in order to remove the surface oxide. The Pb rod was cut into a section of ~10 g. This practice minimized the contamination of the Pb metal from cutting and handling. Red phosphorus and elemental selenium were weighed with respect to the exact mass of the lead metal.

The silica ampoules and plugs (silica rods fitted to ampoule) used for synthesis and crystal growth were first etched with a 2% HF solution in $HNO_3$ in order to remove any surface layer of metallic impurities. The ampoules and plugs were subsequently rinsed with deionized water and 200 proof ethanol. The tubes and the plugs were then baked in a furnace at 1000° C. for 20 hours to remove organic contamination. The furnace was cooled to 200° C. after the baking process.

The baked silica ampoules/plugs were immediately used for sample loading in a moisture controlled, Class 1000 clean room (30% humidity at 25° C.). For each synthesis, up to 30 grams of stoichiometric starting materials were loaded into tapered fused silica ampoules (13 mm ID, 1 mm wall thickness and 250 mm in length). After loading the starting materials, the silica plugs (12 mm Φ, 100 cm long) were inserted to rest directly on top of the raw materials.

Figure 9:
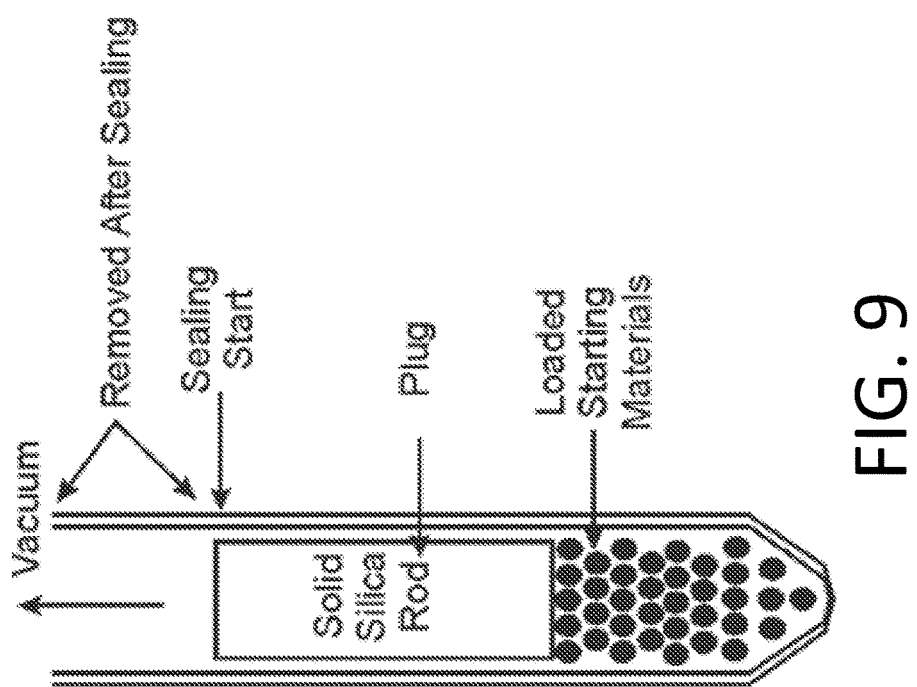
FIG. 9. Schematic diagram of a vacuum sealing configuration.

The loaded sample ampoules were subjected to a bake-out procedure under vacuum using a setup shown schematically in FIG. 9. This setup was composed of a DC-powered heating tape and a graphite tube. While the DC-powered heating tape provided the thermal energy, the high thermal conductivity of the graphite tube ensured the temperature uniformity. The starting materials were baked at 85° C. under a vacuum of $~10^{-4}$ Torr for 2 hours before the ampoules were sealed. The loaded samples were sealed under vacuum by flame starting at the top of the silica plug.

For the initial material synthesis, the sealed samples were heated to 850° C. over 72 hours and held at the maximum temperature for 48 hours before they were cooled to room temperature over 12 hours. The polycrystalline samples were directly subjected to crystal growth in a modified vertical two-zone Bridgman furnace equipped with a computer controlled linear stage. The temperature of the hot zone was 850° C., while the cold zone was 650° C. The crystal growth was carried out with a lowering rate of 1 mm per hour. Once the samples were completely in the cold zone, they were annealed in situ at 650° C. for 24 hrs. Finally, the grown crystals were cooled to room temperature over 24 hours. The temperature gradient in the two-zone Bridgman furnace was estimated to be 8° C./cm. Crack-free crystal ingots were obtained from the crystal growth.

Post-Growth Processes and Detector Fabrication

The $Pb_2P_2Se_6$ single crystals obtained from the Bridgman growth procedure were cut into 2 mm thick wafers perpendicular to the growth direction using a Struers Accutom-50 waferizing saw equipped with a 300 μm wide diamond-impregnated blade. The sample wafers were ground to <1 mm thick by hand on a 1200 grit SiC sand paper before they were hand polished on 4000, 8000, and 12000 grit sand papers. The final fine polishing was performed mechanically with a 0.05 μm suspended $Al_2O_3$ slurry. The residue of the polishing slurry was removed by sonicating the wafers in toluene. The processed $Pb_2P_2Se_6$ crystal wafers were 0.3-0.8 mm thick and exhibited smooth, mirror like surfaces.

The polished samples were preserved under toluene until metallization. Detectors were fabricated by depositing 50 nm of gold on the top and bottom surfaces of each wafer sample using an electron beam evaporator (Auto 500, BOC Edwards) to form parallel-plate device geometries. The detector devices for electrical and γ-ray spectroscopy measurements were made by mounting a sample wafer on to a glass slide with copper stripes, where copper wires were connected to the gold electrodes and copper stripes by colloidal silver paint.

Single Crystal Bandgap

The transmittance spectra of $Pb_2P_2Se_6$ single crystals were recorded in the 450-850 nm wavelength range (1.45-2.75 eV) at room temperature using a Perkin Elmer LAMBDA 1050 spectrophotometer equipped with an integrating SpectralonR sphere. The samples were polished to 0.39 mm thickness using the described procedure. The samples are too thick to accurately measure the absorption coefficient (α) due to a significant contribution from light scattering within the bulk on the crystal. However, the measurement yields an accurate bandgap and the transparency of the various samples can be compared.

Photoluminescence (PL) Measurements

The excitation source for the PL measurements was the 405 nm line from a CW semiconductor diode laser (Excelsior One-405, Spectra-Physics) with the beam diameter of ~1.2 mm. The laser has a constant power of 50 mW, which was varied by using a series of neutral optical density filters. The signal-to-noise ratio was increased using an optical chopper and a lock-in amplifier (SR810, Stanford Research Systems). The PL signals were resolved by a 0.75 m SPEX grating monochromator equipped with a Hamamatsu photomultiplier tube (R928 PMT). The datasets were collected at a rate of 0.5 nm $s^{-1}$, such that a single PL spectrum in the 650-900 nm range can be obtained within 10 mins. A 405 nm bandpass filter with a FWHM of 10 nm (Thorlabs, Inc.) was used to deliver a narrower laser line to the sample. The PL signals were focused using a series of lenses placed between the closed-cycle He cryostat (SHI cryogenics DE-202) and the entrance slit of the monochromator. The scattered and reflected laser light was filtered using a 650 nm sputtered edgepass filter (Thorlabs, Inc) placed in front of the entrance slit of the monochromator (slit widths=200 microns). Either CRY-CON (Air Products and Chemicals) or Apiezon N grease was used to mount the samples on a vertical stage. The grease was applied to the back of the sample and was not excited by the laser beam.

Electronic Transport and Detector Property Measurements

In a typical measurement of I-V characteristics, the applied voltage was swept from 0 V to 300 V using a high voltage power supply (PS300, Stanford Research Systems) and a current meter (Model 2636A, Keithley) measured the current with a dwell time of 10-15 sec. Photoconductivity ($\sigma_{light}$) was measured by using a CW 405 nm laser source for excitation (50 mW, 1.2 mm laser spot diameter). A qualitative measurement of photo-sensitivity was conducted using a custom-made setup. A detector device with a 0.4 mm thickness wafer was put inside a guarded dark box, which was connected to a Keithley source-meter (model 6517b). The sample was exposed to ambient visible light with an ON-OFF state. A 400V bias voltage was applied while the resulting photocurrent was recorded as a function of time.

For the detector response measurement, $Pb_2P_2Se_6$ detector devices were exposed to a 0.25 μCi $^{57}Co$ source. In each measurement, the fabricated detector device connected to an eV-550 preamplifier was placed in a customized sample box. Depending on the thickness of the sample wafer, a positive bias between 400V and 800 V was applied. The maximum electric field maintained on a device was ~$2\times10^5 Vm^{-1}$. The detector signals were amplified (ORTEC 572A amplifier) with a gain of 200 and shaping time of 6 μs. The electronic signals were subsequently measured by a dual 16 K input multichannel analyzer (Model ASPEC-927) and read using MAESTRO-32 software. A SPEAR CZT detector operated under a similar electric field condition was used as a reference device.

Thermodynamic Stability and Electronic Structure Calculations

First-principles total energy calculations within the density functional theory framework were employed to investigate the thermodynamic stability, electronic structure, and defect properties of $Pb_2P_2Se_6$. The projector augmented wave (PAW) method as implemented in the VASP code was employed. (See, Kresse, G.; Hafner, J. *Physical Review B* 1993, 47, 558 and Kresse, G.; Furthmüller, J. *Physical Review B* 1996, 54, 11169.) The energy cut off for the plane wave basis was set to 350 eV and a regular k-point mesh generated according to the Monkhorst-Pack scheme with the density of 50 (Å)$^{-1}$ was used for Brillouin zone sampling. (See, Monkhorst, H. J.; Pack, J. D. *Physical Review B* 1976, 13, 5188.) The exchange-correlation contribution to the potential was included using the generalized gradient approximation (GGA) within the Perdew-Burke-Ernzerhof (PBE) functional. (See, Perdew, J. P.; Burke, K.; Ernzerhof, M. *Phys. Rev. Lett.* 1996, 77, 3865.) To describe the isolated defects and impurities, 2×2×2 supercells containing 160 atoms and a 3×3×3 k-point mesh were utilized. The internal atomic positions of the defect structures were fully relaxed until the residual forces on atoms were less than 0.01 eV/A while the lattice parameters of the supercells remained fixed.

Reduction of Oxygen

The Glow Discharge Mass Spectrometry (GD-MS) analysis performed on the $Pb_2P_2Se_6$ single crystal samples grown from the as-purchased materials revealed less than 5 ppm total impurity (Table 5). According to the GD-MS analysis of the $Pb_2P_2Se_6$, the major impurities were alkaline metals (Na, K), Cu, Si and S. The alkaline metals likely came from the silica ampoule used for synthesis and crystal growth, which should be significantly reduced by using low-alkaline quartz products. The copper impurity (0.23 ppm) was introduced during the Se mining and refining processes. The most dominant impurity, sulfur at 3 ppm, is isoelectronic with Se, thus should have limited impact on the electronic transport properties of $Pb_2P_2Se_6$.

TABLE 5

Glow Discharge Mass Spectrometry (GD-MS) impurity analysis of a $Pb_2P_2Se_6$ single crystal samples. Only the impurity elements above the detection limit are listed.

| Element | Concentration (ppm wt.) |
|---------|-------------------------|
| Na      | 0.16                    |
| Si      | 0.21                    |
| S       | 3                       |
| K       | 1.7                     |
| Cu      | 0.23                    |

Although the GD-MS analysis showed reasonably low impurity content, the concentration of oxygen in the $Pb_2P_2Se_6$ samples remained unknown. The final oxygen and moisture level inside the sample ampoule should be very low after a prolonged evacuation (~2 hours) at a pressure of ~$10^{-4}$ Torr. However, even the small amount of remaining oxygen and moisture can have detrimental effects on the crystal quality due to the rapid reactivity with the lead metal to form lead oxide. Lead oxide can fuse with the silica ampoule wall to form spots or film of lead glass resembling "watermarks" on the silica wall. During the crystal growth of $Pb_2P_2Se_6$, the spots of Pb on the glass tube act as parasitic nucleation centers introducing competing grains from the ampoule wall. Furthermore, the interaction between these Pb spots and the crystal ingot prevented the release of the ingot from the ampoule. A small amount of oxygen/moisture can cause a strong "sticking" effect between the ampoule and the crystal ingot. Such a chemical reaction between the oxides in the $Pb_2P_2Se_6$ melt and the ampoule wall is also suspected to introduce the Si impurity into the crystal system. Most importantly, oxygen impurity is well known for its detrimental effect on the transport properties of many semiconductors.

First-principles electronic structure calculations of oxygen defects were carried out using the supercell approach in order to understand the effect of oxygen on the electronic properties of $Pb_2P_2Se_6$. Oxygen interstitials and oxygen substitutional defects were considered. Owing to its significantly smaller atomic radius, oxygen prefers to occupy interstitial positions rather than substitute other atoms in the structure (66 nm, compared with 107, 120, and 146 nm for P, Se, and Pb, respectively). There are four unique interstitial sites in the $Pb_2P_2Se_6$ unit cell that O atoms can occupy. Among substitutional positions, O replacing Se is strongly preferred energetically over other substitutions. The effect of oxygen on the electronic properties of $Pb_2P_2Se_6$ was analyzed based on the comparison of the calculated electronic band structures for pure and defected supercells.

Figures 10A, 10B, 10C:
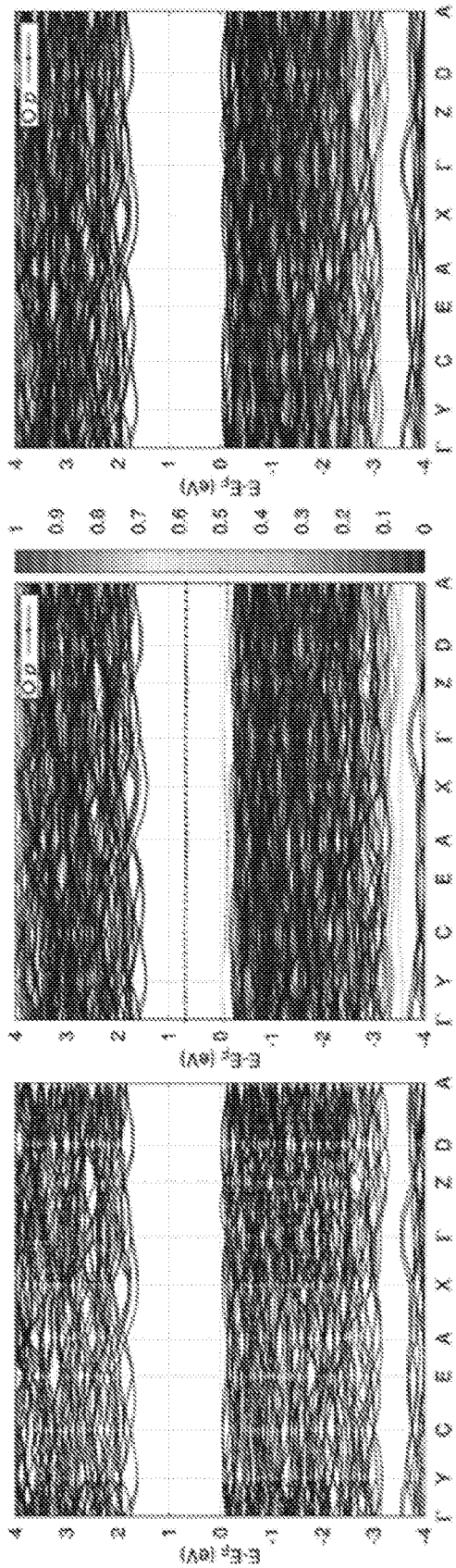
FIG. 10A. Electronic band structure of $Pb_2P_2S_6$ 160-atom supercells: defect-free.
FIG. 10B. Electronic band structure of $Pb_2P_2S_6$ 160-atom supercells: containing one interstitial oxygen atom.
FIG. 10C. Electronic band structure of $Pb_2P_2S_6$ 160-atom supercells: containing 1 oxygen atom replacing Se atom. Shades of bands reflect contribution from O p states.

The calculated electronic band structure of defect-free $Pb_2P_2Se_6$, plotted along the lines between the high-symmetry points in the Brillouin zone (BZ), is shown in FIG. 10A. The band structure of a supercell has a larger number of bands compared with that of a primitive unit cell due to band downfolding. The main features of the supercell such as character and width of the band gap and the character of the states near the band edges, however, remain unchanged. The calculated band structure shows that $Pb_2P_2Se_6$ is an indirect band gap material with the PBE band gap of 1.60 eV (FIG. 10A). This calculated value is slightly underestimated compared with the measured value of 1.88 eV. Underestimation of band gaps is a known issue of DFT calculations employing exchange-correlation functionals based on the local density approximation, such as PBE. The band gap value corrected by the calculations employing hybrid functional scheme is 2.0 eV, as reported in a previous work. (See, Wang, P. L.; Liu, Z.; Chen, P.; Peters, J. A.; Tan, G.; Im, J.; Lin, W.; Freeman, A. J.; Wessels, B. W.; Kanatzidis, M. G. Adv. Funct. Mater. 2015, 25, 4874.) The band structure of $Pb_2P_2Se_6$ with an interstitial O atom ($O_{int}$) shows that the presence of oxygen leads to the formation of two new electronic levels within the band gap (FIG. 10B): a deep level located near the middle of the gap, and a shallow acceptor level near the valence band maximum (VBM). To demonstrate that these levels are in fact due to oxygen, the site-resolved and orbital-projected wavefunction character of each band was calculated (FIG. 10B). The new levels were mostly comprised of O p states, while contribution of oxygen to most of the other bands was very small. Similar behavior was observed for oxygen in other interstitial positions and in different charge states. These results confirm that $O_{int}$ impurities are detrimental to the electronic and detector properties of $Pb_2P_2Se_6$ because they can act as deep-level traps that could be responsible for nonradiative recombination of carriers due to carrier capture.

The band structure of $Pb_2P_2Se_6$ was also calculated with an oxygen atom substituting one of the Se atoms (FIG. 10C). In stark contrast to the interstitial oxygen calculation, O-for-Se substitution ($O_{Se}$) did not create any levels within the band gap and mostly contributed to the bands that are located 2-3 eV below the valence band. The changes to the band structure were largely due to a slight distortion of the structure around the defect. This distortion led to the removal of band degeneracy and a minor shift of the resulting non-degenerate bands with respect to each other. Subsequently, the bands became much denser but there is no change in the character and width of the bands near the band edges. Since O and Se are electronic analogues belonging to the same group in the Periodic Table, O-for-Se substitution did not change the character of chemical bonding in this system. Therefore, the $O_{Se}$ defect was electrically inert and will not have any detrimental effect on the detector properties of $Pb_2P_2Se_6$.

The results of the first-principles calculations suggest that the detrimental effect of oxygen on the electronic properties of $Pb_2P_2Se_6$ can be avoided by reducing its level below the level of Se vacancies. In such a case, oxygen will occupy Se vacancy positions rather than interstitial ones, becoming electrically benign. Thermodynamic stability calculations show that Se vacancies are the prevalent native defects and have the lowest formation energy and therefore are easily created [see discussion below]. Se-poor growth conditions promote Se-vacancy formation and can further facilitate oxygen removal by trapping it at the Se-vacancy sites.

In addition to the oxygen contamination in the starting materials, moisture adsorbed onto the inner wall of the silica ampoules was found to be a major source of oxygen. A baked silica tube can adsorb enough moisture on its inner surface within a few hours to cause noticeable "sticking" between crystal and the growth ampoule. Thus, the silica ampoules were immediately used for sample loading after baking. Other experimental procedures, such as metal etching and vacuum baking of raw materials, were also implemented to further reduce the oxygen content. Due to the elusive nature of the oxygen impurity, the reduction of the oxygen levels could not be quantified. However, a clear elimination of the "water-mark" like oxide film accompanied by an improved release of ingots from the ampoules was observed. The successful reduction of oxygen impurity, together with a better stoichiometry control, resulted in the improved optical and electrical properties in the $Pb_2P_2Se_6$ samples.

Secondary Phase and Stoichiometric Control

Figure 11:
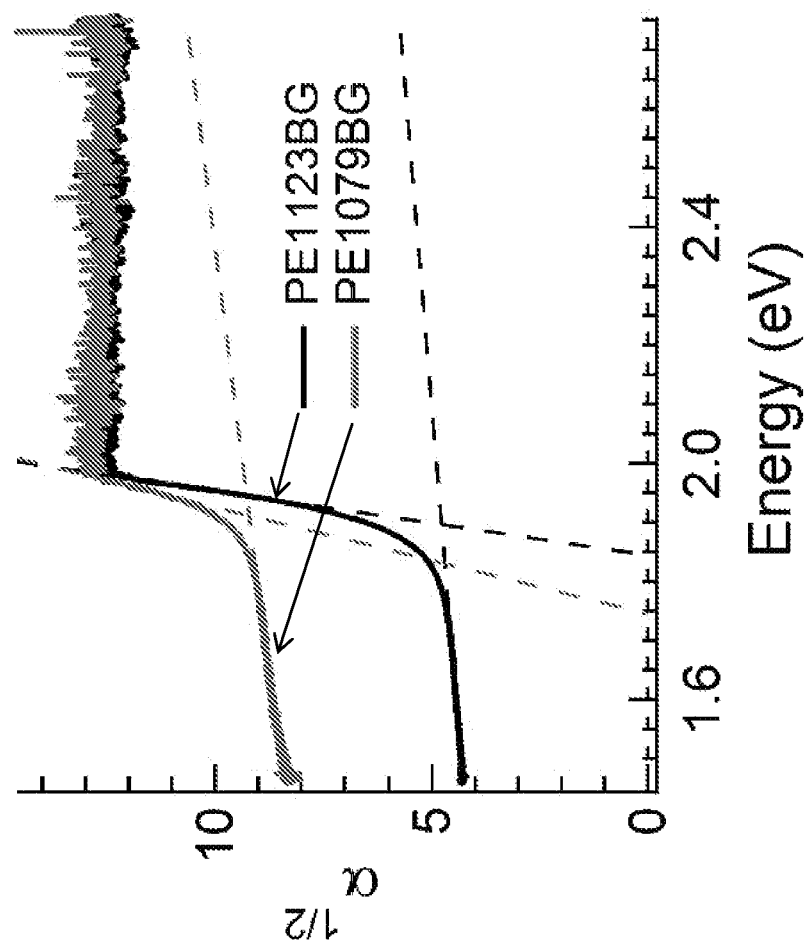
FIG. 11. UV-Vis transmittance experiments measuring the band gap of $Pb_2P_2Se_6$ samples with (PE1079) and without (PE1123) secondary phase precipitates.

In addition to the difficulties encountered with oxygen and moisture contamination, the $Pb_2P_2Se_6$ crystals were plagued with secondary phase precipitation. The precipitate can be clearly observed under an optical microscope in a transmission mode. To further understand the nature of the observed precipitation, single crystal wafers of $Pb_2P_2Se_6$ with and without precipitates were subjected to UV-Vis transmittance spectroscopy. Compared to the precipitate-free $Pb_2P_2Se_6$ crystal, a sample with a black secondary phase exhibited a similar band gap value while displaying a much lower transmittance to light (FIG. 11). Hence, the black precipitation in the crystal can be attributed to a secondary phase unrelated to the $Pb_2P_2Se_6$ matrix and has a no impact on its optical band gap.

Figures 12A, 12B:
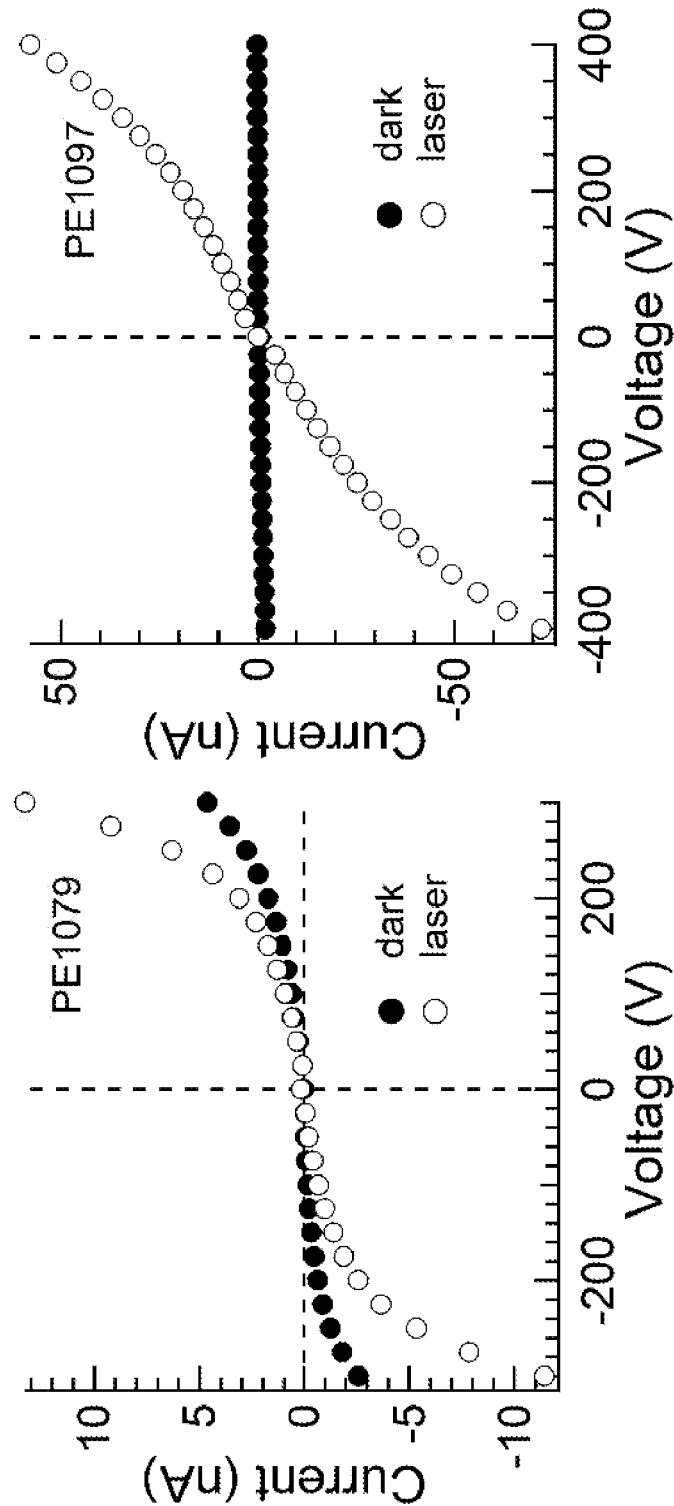
FIG. 12A. The photo-electrical responses of two $Pb_2P_2Se_6$ samples with observable precipitates.
FIG. 12B. The photo-electrical responses of two $Pb_2P_2Se_6$ samples without observable precipitates. These samples were illuminated by a 50 mW, 405 nm CW laser at room temperature.

In addition to the poor optical transparency below the bandgap, the $Pb_2P_2Se_6$ samples with secondary phase inclusions also exhibited poor electrical properties and photo response (FIG. 12A) in comparison to the samples without visible precipitates (FIG. 12B). Although both samples possessed similar electrical resistance under low bias voltages, a non-linear current-voltage behavior was observed for the sample with a secondary phase in the dark as well as under laser radiation. Such an observation is consistent with an electrical breakdown behavior under applied voltage. In contrast, the sample without secondary precipitates displayed more linear current-voltage characteristics over a larger voltage range. More importantly, a large photo response to the 405 nm laser radiation was also observed for the $Pb_2P_2Se_6$ sample free of secondary phase.

Photoluminescent (PL) Properties

Figures 13A, 13B:
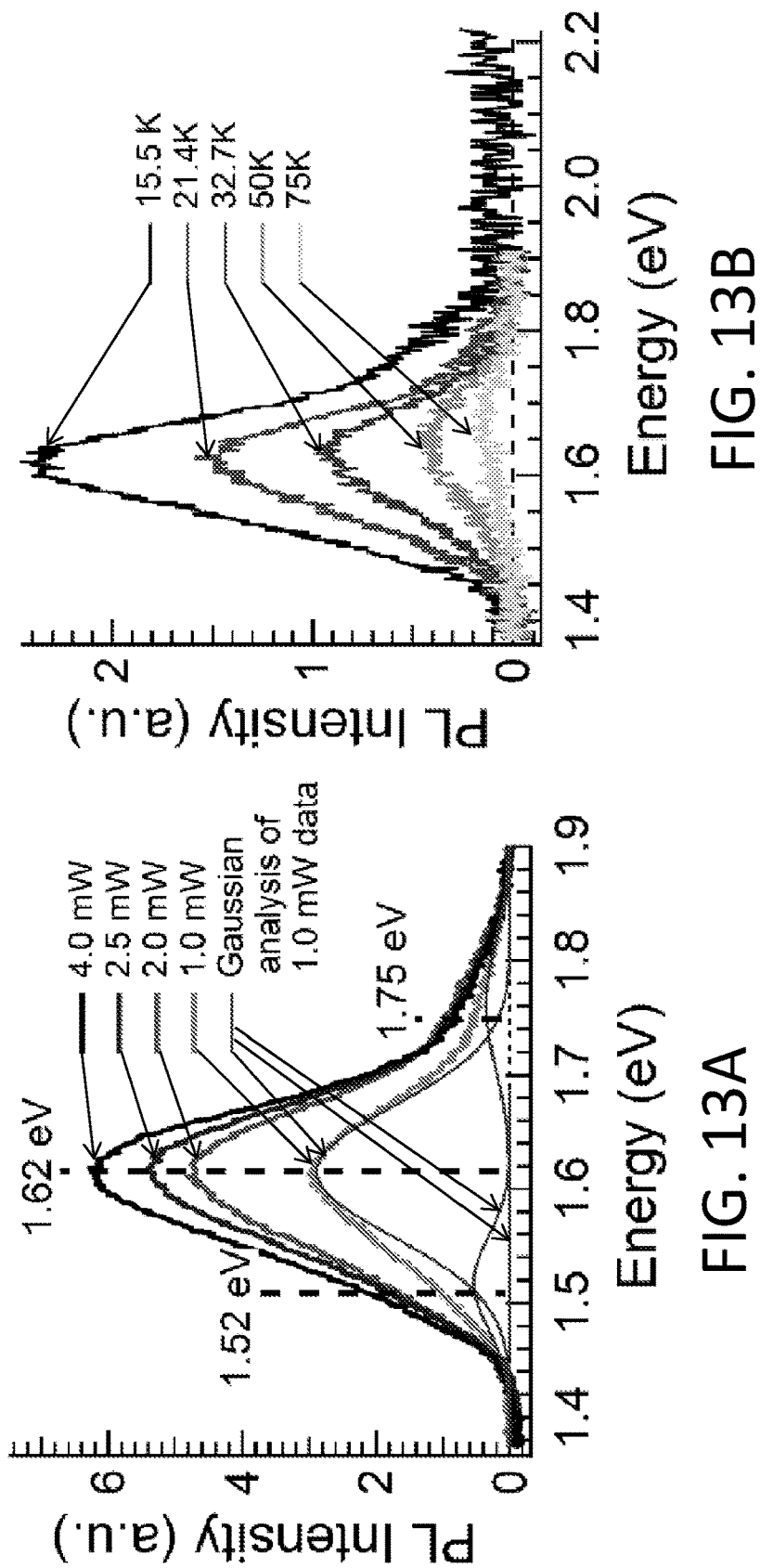
FIG. 13A. Power dependence at 15.5 K using 1.6 mW, on the photoluminescence spectra of a $Pb_2P_2Se_6$ sample.
FIG. 13B. Temperature dependence at 15.5 K using 1.6 mW, on the photoluminescence spectra of a $Pb_2P_2Se_6$ sample.

PL properties of several grown $Pb_2P_2Se_6$ single crystals from different growth runs were investigated. For the uniform and transparent samples a broad PL emission was observed in the 1.5-1.8 eV range at 15 K, comprised of three peaks centered at 1.52, 1.62 and 1.75 eV (FIGS. 13A and 13B). Samples with no response to γ radiation and visible precipitation, however, showed no near-band edge PL at low temperature. In most of these cases, green localized luminescence centers were observed. Exploration of a sample cut from the heel of an ingot suggests that the green "dots" are caused by the presence of a small amount of lead oxide, which collects in the tip of the tube and exhibits green PL emission.

It is well known that the PL intensity (I) is proportional to $L^k$, where L is the laser power and the exponent k describes the nature of the observed transition. (See, Schmidt, T.; Lischka, K.; Zulehner, W. Phys. Rev. B 1992, 45, 8989.) Excitonic transitions show k values in the 1<k<2 range, while free-to-bound and donor-acceptor pair (DAP) transitions are characterized by the value of k<1. The power dependence on the PL intensity of the three peaks was investigated at 15.5 K (FIG. 13A). The intensity of the peaks decreased with decreasing laser power, such that the plots of log (PL intensity) vs. log (laser power) were linear with the corresponding values of k of 1.1±0.2, 0.48±0.09, and 0.5±0.2 for peaks centered at 1.52, 1.62, and 1.75 eV, respectively. Therefore, the peaks centered at 1.62 and 1.75 eV were due to DAP recombination, while that at 1.52 eV was due to a bound exciton. The two lower energy peaks (1.52 eV and 1.62 eV) exhibited a blueshift with increasing laser power, while the peak at 1.75 eV appeared to redshift. In addition, a slight peak broadening was observed with increasing laser power for the peaks at 1.52 and 1.75 eV, while the full width at half maximum (FWHM) of the peak at 1.62 eV did not vary significantly.

To determine activation energies of the defect levels, the dependence of PL intensity on temperature was examined. The Arrhenius plots of the dependence of the integrated PL intensity on temperature for a DAP and excitonic emissions are described by Eq. 1 and Eq. 2, respectively, where I(0) is the extrapolated zero-temperature intensity, $k_B$, $\varphi_1$, $\varphi_2$, $C_1$ and $C_2$ are constants, $E_a$ is the thermal activation energy of a defect level and $E_1$ is the thermal ionization energy of a bound exciton.

$$I(T) = \frac{I(0)}{1 + \varphi_1 T^{3/2} + \varphi_2 T^{3/2} \exp\left(-\frac{E_a}{k_B T}\right)} \quad (1)$$

$$I(T) = \frac{I(0)}{1 + C\exp\left(-\frac{E_1}{k_B T}\right)} \quad (2)$$

Figures 14A, 14B:
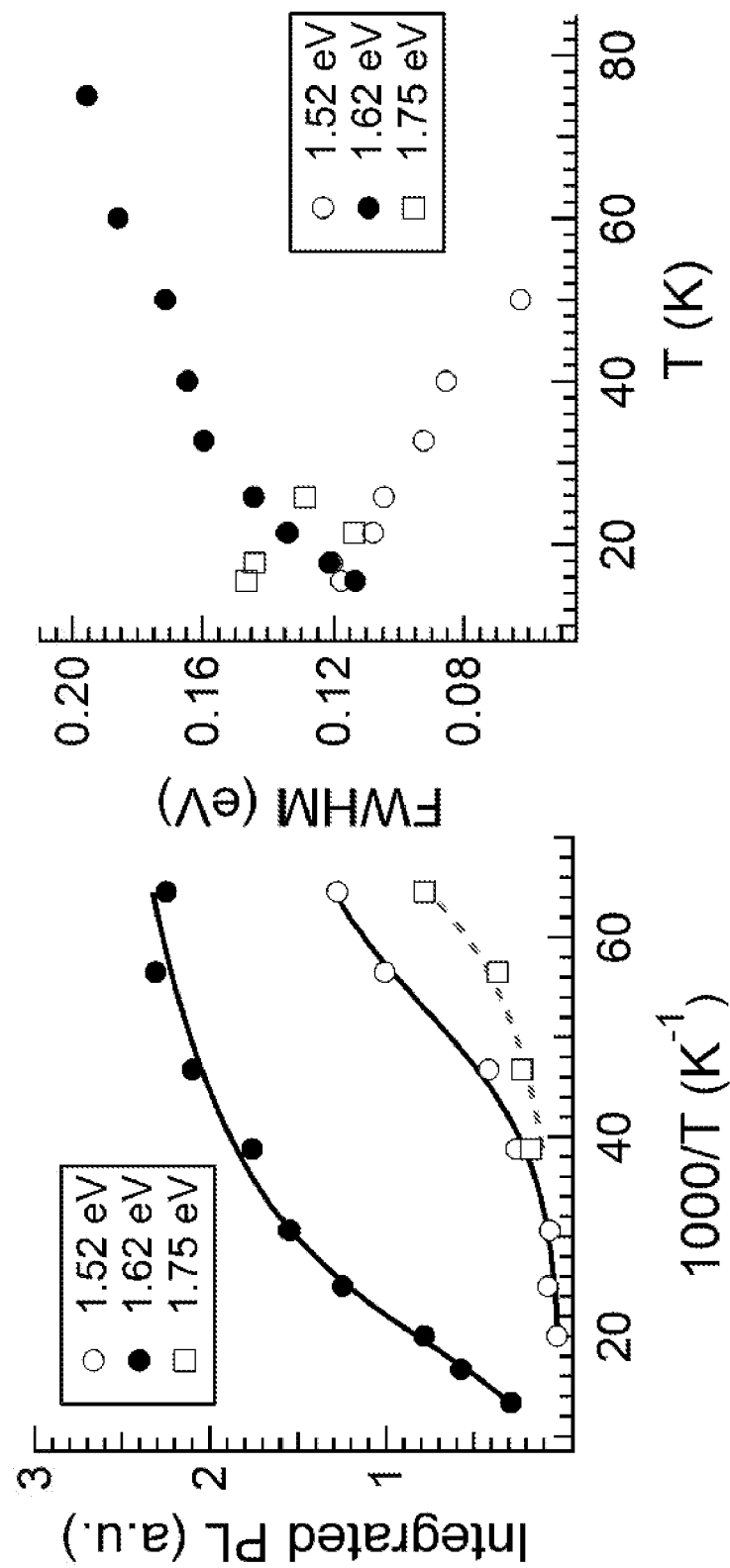
FIG. 14A. Plot of integrated PL intensity vs. 1000/T collected using 1.6 mW laser power for excitation for the three peaks observed in $Pb_2P_2Se_6$.
FIG. 14B. Plot of integrated FWHM vs. T collected using 1.6 mW laser power for excitation for the three peaks observed in $Pb_2P_2Se_6$. The solid lines are fittings of the data to Eq. 1, while the dotted line is a guide to the eye.

Plots of integrated PL intensity vs. 1000/T revealed that the peak centered at 1.75 eV underwent rapid thermal quenching, precluding determination of its activation energy (FIG. 14A). The fitting parameters for peaks centered at 1.52 and 1.62 eV to Eq. 2 and Eq. 1, respectively, are given in Table 6. Activation energies of $E_1 = 11 \pm 2$ and $E_a = 15 \pm 7$ meV were obtained, which were the same within error. The error is due to the fact that the PL emission was weak, and thermal quenching limits the temperature range at which the signals could be detected. In addition to the activation parameters, the temperature dependent data revealed that the DAP peak at 1.62 eV blueshifted and broadened with increasing temperature, while the excitonic peak at 1.52 eV redshifted and became narrower (FIG. 14B). The redshift and an increase in full width at half maximum (FWHM) were expected due to the temperature-dependent bandgap widening and thermal broadening, respectively. However, the blueshift and peak narrowing were unexpected.

TABLE 6

Fitting parameters of the plots of integrated PL intensity vs. T to Eq. 1 (1.62 eV peak) and Eq.2 (1.52 eV peak).

| Parameter | 1.52 eV peak | 1.62 eV peak |
|---|---|---|
| I (0) (a.u.) | 0.16 ± 0.02 | 0.30 ± 0.03 |
| $\varphi_1$ | — | 0.005 ± 0.002 |
| $\varphi_2$ | — | 0.1 ± 0.1 |
| $E_a$ (meV) | — | 15 ± 7 |
| C | 1000 ± 800 | — |
| $E_1$ (meV) | 11 ± 2 | — |

Thermodynamic Stability

Due to the detrimental effect of the secondary phase precipitates on the optical and electrical properties of $Pb_2P_2Se_6$, its formation conditions were studied by first-principles total energy calculations of thermodynamic stability. The growth of $Pb_2P_2Se_6$ can be limited by the existence of competing phases such as binary phases and other ternary compounds in the Pb—P—Se system. Pure and precipitate-free $Pb_2P_2Se_6$ can only be grown in a limited range of chemical potentials of its components. A set of linear equation (Eq. 3-Eq. 5) balancing heat of formation ($\Delta H_F$) of $Pb_2P_2Se_6$ with $\Delta H_F$ of the competing phases and with the chemical potentials $\Delta\mu_\alpha$ of elemental components describes the region where $Pb_2P_2Se_6$ can be stabilized:

$$2\Delta\mu_{Pb} + 2\Delta\mu_P + 6\Delta\mu_{Se} = \Delta H_F(Pb_2P_2Se_6) \quad (3)$$

$$\Delta\mu_\alpha \leq 0 \quad (4)$$

$$n_{Pb}\Delta\mu_{Pb} + n_P\Delta\mu_P + n_{Se}\Delta\mu_{Se} \leq H_F(\text{competing phases}) \quad (5)$$

Figure 15:
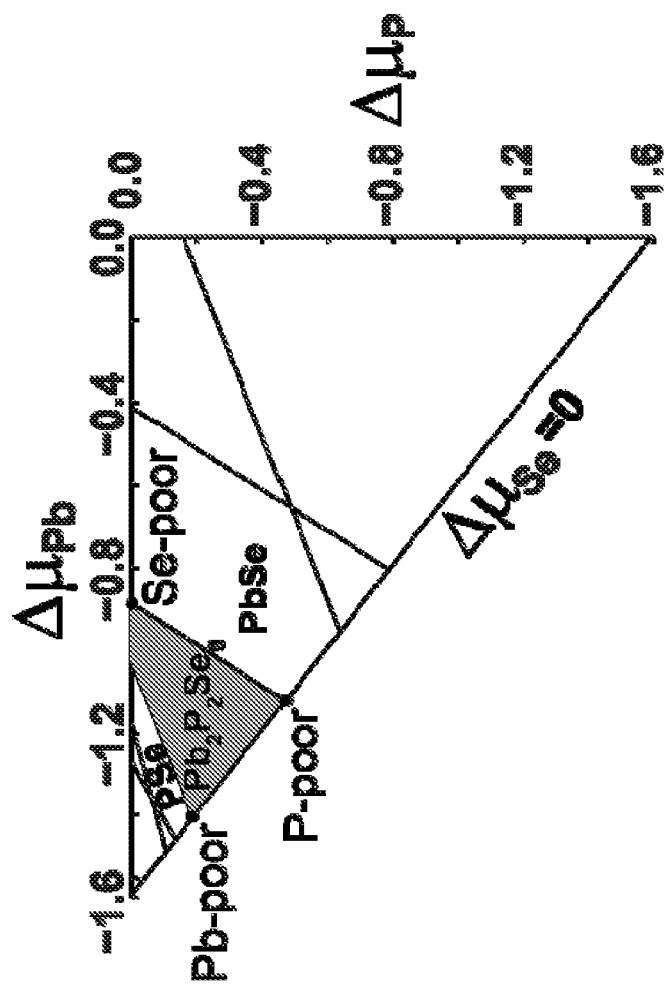
FIG. 15. Thermodynamic stability of the $Pb_2P_2Se_6$ phase determined from the calculated ranges of chemical potentials under thermodynamic equilibrium with competing phases.

The following phases are known to exist in the Pb—P—Se system: PbSe (3 structural forms), $PbSe_2$, PSe, $P_4Se_3$ (2 structural forms) and $P_4Se_5$. The calculated region of thermodynamic stability of $Pb_2P_2Se_6$ is presented in FIG. 15 in the form of stability phase diagram. The shaded region in the diagram corresponds to the range of chemical potentials that allow the growth of $Pb_2P_2Se_6$ without formation of other competing phases. The extreme points of this region, marked by circles, correspond to Pb-poor, P-poor, or Se-poor growth conditions. The stability region of $Pb_2P_2Se_6$ is sufficiently wide, which suggests that this compound can be grown precipitate-free even if there is a substantial variance in growth conditions. The Pb-poor condition results in P—Se binaries which are not stable at the melting point of $Pb_2P_2Se_6$ (798° C.), but may still form and precipitate after cooling. However, both P-poor and Se-poor conditions promote the formation of other Pb—Se phases, which are known to be stable at high temperature. The thermodynamic stability of native defects was also calculated. Results indicated that selenium vacancies ($V_{Se}$) are the most dominant defects but are, however, electronically inactive.

To determine the nature of the secondary phase precipitation in $Pb_2P_2Se_6$, a decomposition test was performed as follows. A piece of an as grown $Pb_2P_2Se_6$ single crystal sample was first heated under a temperature gradient in a single zone tube furnace heated to 600° C. A temperature gradient was created by placing a long silica ampoule in the furnace such that the end containing the $Pb_2P_2Se_6$ single crystal was heated by the furnace while the empty end was exposed to room temperature. After heating the $Pb_2P_2Se_6$ sample for 48 hours, a significant amount of black/red materials were deposited at the colder end of the tube. The $Pb_2P_2Se_6$ sample at the right side of the tube was heated below melting temperature, while the decomposition products were transported to the cold end of the tube along the temperature gradient. Analysis of the decomposition products by energy dispersive spectroscopy (EDS) revealed that the $Pb_2P_2Se_6$ sample had completely decomposed into the most thermodynamically stable lead-selenium binary, PbSe. The more volatile phosphorus and selenium were driven by the temperature gradient to the cold end of the tube to form P—Se binary glass. The dark precipitates observed in the poor quality samples of $Pb_2P_2Se_6$ were PbSe binary resulting from the loss of volatile P and Se.

Figure 16:
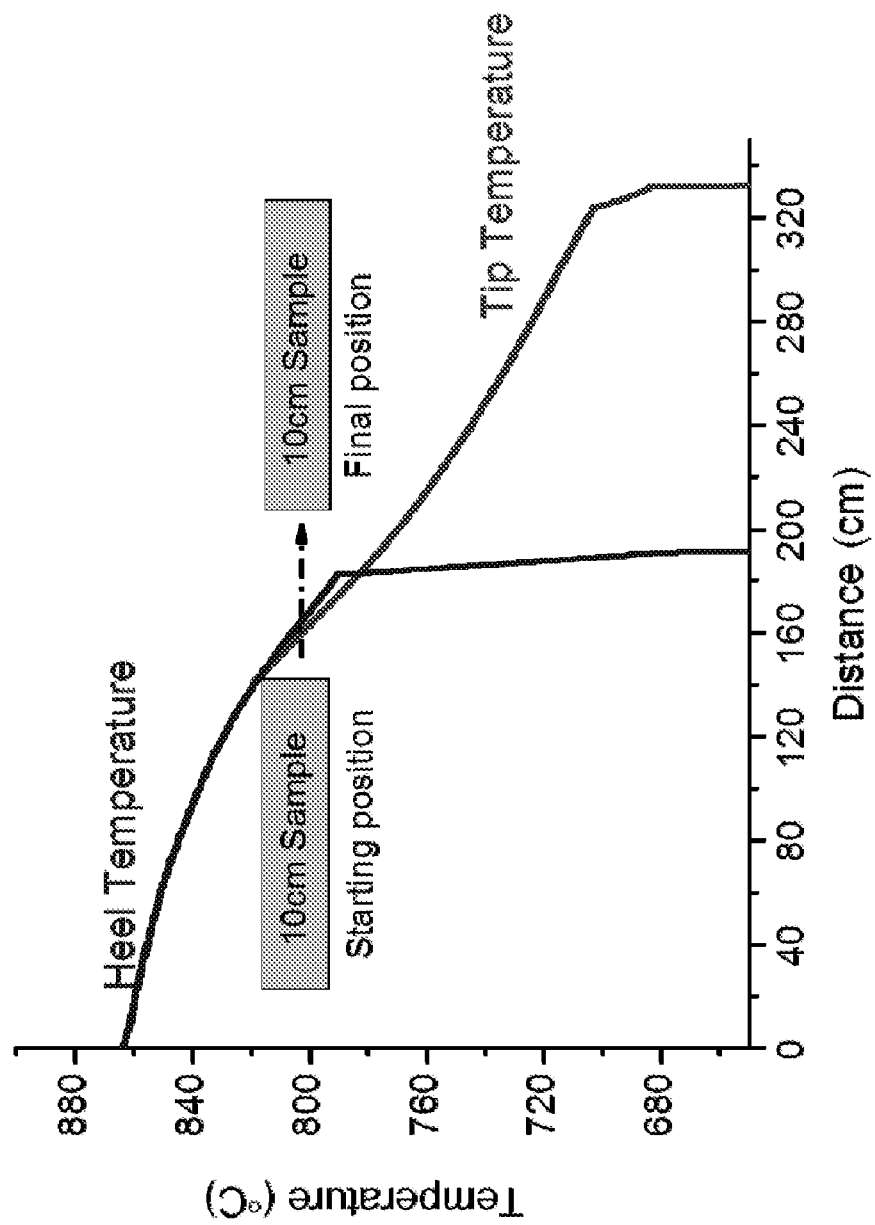
FIG. 16. Temperature profile of a Bridgman growth measured at the tip and heel of a sample.

In addition to the decomposition experiment, a series of controlled experiments were performed where the $Pb_2P_2Se_6$ single crystal samples were subjected to different temperature gradients. The experiments indicated that the ternary $Pb_2P_2Se_6$ phase went through a congruent vapor transport between 900° C. and 650° C. without decomposition, indicating a critical temperature around 650° C. Below this temperature the decomposition of the ternary becomes favorable. Owing to these experiments, the temperature profile of the Bridgman growth procedure was optimized such that no part of the sample ampoule was cooled below 650° C. through the growth. A typical temperature profile of a Bridgman growth is shown in FIG. 16. The temperatures at the tip and heel part of the ampoule were measured by two separated thermocouples during the crystal growth.

Detector Properties

Figure 17:
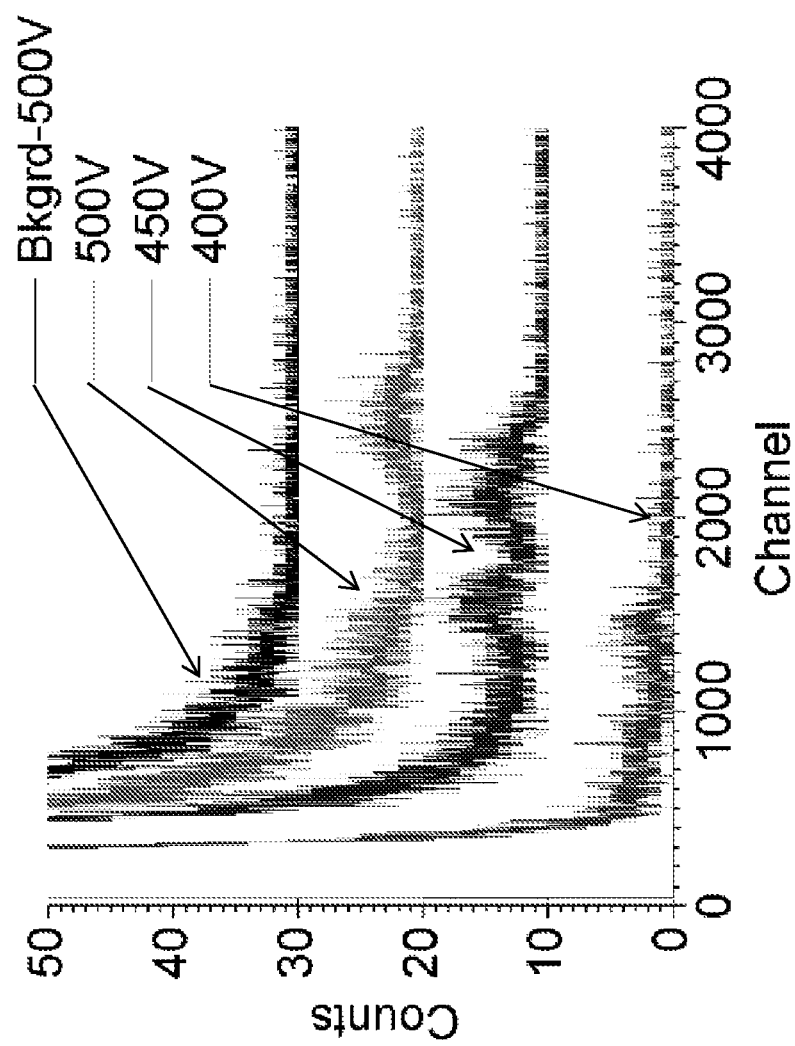
FIG. 17. A typical spectroscopic response from a $Pb_2P_2Se_6$ sample under $^{57}Co$ source radiation. The data were collected under 400V (bottom spectrum), 450V (second to bottom spectrum) and 500V (second to top spectrum) bias and compared to the background at 500V (top spectrum).

Subsequent studies on $Pb_2P_2Se_6$ of Example 1 revealed that the detector response could be variable due to lack of reproducibility in the synthesis and crystal growth processes. A slight compositional deviation or higher oxygen content usually could render the entire crystal ingot unresponsive to any radiation (ambient light, visible laser, X-ray and γ-ray). By improving the experimental procedures, $Pb_2P_2Se_6$ single crystals can be consistently obtained with a γ-ray detection response. FIG. 17 shows a typical spectroscopic response for a $^{57}Co$ source from a $Pb_2P_2Se_6$ sample. These spectra showed clearly distinguishable peaks that were responsive to the change of bias voltage.

The mobility-lifetime products of electron carriers in these samples were estimated using the maximal charge collection efficiency (CCE) under each bias voltage applied to the sample. (See, Ruzin, A.; Nemirovsky, Y. *J. Appl. Phys.* 1997, 82, 4166.) The details of this method were presented in Example 1 and in a previous report. (See, Wang, P. L.; Liu, Z.; Chen, P.; Peters, J. A.; Tan, G.; Im, J.; Lin, W.; Freeman, A. J.; Wessels, B. W.; Kanatzidis, M. G. *Adv. Funct. Mater.* 2015, 25, 4874.) At the current stage of development the electron mobility-lifetime product ($\mu\tau_e$) of the $Pb_2P_2Se_6$ detectors are in the range of $1\times10^{-5}$ cm$^2$/V.

Concluding Remarks

In order to produce more consistently high quality single crystal samples of $Pb_2P_2Se_6$ for hard radiation detection investigations, the experimental procedures of synthesis and crystal growth were improved and further standardized. Two major factors affecting the reproducibility, oxygen contamination and off stoichiometry, were mitigated. The first-principles electronic band structure calculation of $Pb_2P_2Se_6$ shows that the presence of $O_{int}$ atoms leads to the formation of two new electronic levels within the band gap: a deep level located near the middle of the gap, and a shallow acceptor level near the valence band maximum. In addition, total energy DFT calculations of the heat of formation ($\Delta H_F$) of $Pb_2P_2Se_6$ indicated that the region of thermodynamic stability was sufficiently wide. This suggested that this compound could be grown precipitate-free even if there was a substantial variance in growth conditions. The impact of oxygen on the quality of the $Pb_2P_2Se_6$ crystal ingot was observed through the chemical reaction between oxide species and the silica ampoule, while the nature of the off stoichiometry was studied experimentally. Furthermore, experimental procedures and crystal growth conditions were implemented to improve the electrical and optical properties of the single crystal based on an understanding of the phase stability of the $Pb_2P_2Se_6$ system. PL studies indicated that luminescence was only observed from samples which showed response to γ-ray radiation. Crystals of low quality showed green PL centers attributed to PbO precipitates. The higher quality $Pb_2P_2Se_6$ single crystals exhibited two peaks due to DAP recombination centered at 1.62 eV and 1.75 eV, and one excitonic peak at 1.52 eV. The refined synthesis and crystal growth processes provided $Pb_2P_2Se_6$ samples with excellent optical transparency and high electrical resistivity, as well as good photoluminescent and photoconductive properties. Importantly, these samples showed spectroscopic responses to $^{57}Co$ γ-ray radiation leading to an estimation of the $\mu\tau_e$ product in the range of $1\times10^{-5}$ cm$^2$/V.

The word "illustrative" is used herein to mean serving as an example, instance, or illustration. Any aspect or design described herein as "illustrative" is not necessarily to be construed as preferred or advantageous over other aspects or designs. Further, for the purposes of this disclosure and unless otherwise specified, "a" or "an" means "one or more".

The foregoing description of illustrative embodiments of the invention has been presented for purposes of illustration and of description. It is not intended to be exhaustive or to limit the invention to the precise form disclosed, and modifications and variations are possible in light of the above teachings or may be acquired from practice of the invention. The embodiments were chosen and described in order to explain the principles of the invention and as practical applications of the invention to enable one skilled in the art to utilize the invention in various embodiments and with various modifications as suited to the particular use contemplated. It is intended that the scope of the invention be defined by the claims appended hereto and their equivalents.

What is claimed is:

1. A method for detecting incident radiation, the method comprising:
   exposing a material comprising an inorganic compound having the formula $A_2P_2X_6$, where A represents Pb or Sn and X represents S or Se, to incident gamma radiation, x-ray radiation, or a combination thereof, wherein the material absorbs the incident radiation and electron-hole pairs are generated in the material; and
   measuring at least one of the energy or intensity of the absorbed incident radiation by detecting the generated electrons, holes, or both.

2. The method of claim 1, wherein A represents Pb.

3. The method of claim 2, wherein X represents Se.

4. The method of claim 3, wherein the inorganic compound has a bandgap of at least 1.6 eV and an electrical resistivity of at least $10^{10}$ Ω·cm at 23° C.

5. The method of claim 3, wherein the inorganic compound has a bandgap of at least 1.7 eV and an electrical resistivity of at least $10^{11}$ Ω·cm at 23° C.

6. The method of claim 3, wherein the material does not contain any impurity element at a concentration of greater than 2 ppm wt., other than impurity elements that are isoelectronic with Se.

7. The method of claim 2, wherein the inorganic compound has a bandgap of at least 1.6 eV and an electrical resistivity of at least $10^{10}$ Ω·cm at 23° C.

8. The method of claim 2, wherein the inorganic compound has a bandgap of at least 1.7 eV and an electrical resistivity of at least $10^{11}$ Ω·cm at 23° C.

9. The method of claim 2, wherein the material does not contain any impurity element at a concentration of greater than 2 ppm wt., other than impurity elements that are isoelectronic with Se.

10. The method of claim 1, wherein X represents Se.

11. The method of claim 1, wherein the inorganic compound has a bandgap of at least 1.6 eV and an electrical resistivity of at least $10^{10}$ Ω·cm at 23° C.

12. The method of claim 1, wherein the inorganic compound has a bandgap of at least 1.7 eV and an electrical resistivity of at least $10^{11}$ Ω·cm at 23° C.

13. The method of claim 1, wherein the material does not contain any impurity element at a concentration of greater than 2 ppm wt., other than impurity elements that are isoelectronic with the X element of the inorganic compound.

14. A device for the detection of incident radiation comprising:
   a material comprising an inorganic compound having the formula $A_2P_2X_6$, where A represents Pb or Sn and X represents S or Se;

a first electrode in electrical communication with the material;

a second electrode in electrical communication with the material, wherein the first and second electrodes are configured to apply an electric field across the material; and a detector configured to measure a signal generated by electron-hole pairs that are formed when the material is exposed to incident gamma radiation, x-ray radiation, or a combination thereof.

15. The device of claim 14, wherein A represents Pb.

16. The device of claim 15, wherein X represents Se.

17. The device of claim 16, wherein the inorganic compound has a bandgap of at least 1.6 eV and an electrical resistivity of at least $10^{10}$ $\Omega \cdot cm$ at 23° C.

18. The device of claim 15, wherein the inorganic compound has a bandgap of at least 1.6 eV and an electrical resistivity of at least $10^{10}$ $\Omega \cdot cm$ at 23° C.

19. The device of claim 14, wherein X represents Se.

20. The device of claim 14, wherein the inorganic compound has a bandgap of at least 1.6 eV and an electrical resistivity of at least $10^{10}$ $\Omega \cdot cm$ at 23° C.

* * * * *